(12) United States Patent
Sakuma et al.

(10) Patent No.: US 7,393,747 B2
(45) Date of Patent: Jul. 1, 2008

(54) NONVOLATILE SEMICONDUCTOR MEMORY AND A FABRICATION METHOD THEREOF

(75) Inventors: Makoto Sakuma, Yokohama (JP); Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/337,001

(22) Filed: Jan. 23, 2006

(65) Prior Publication Data

US 2006/0131638 A1    Jun. 22, 2006

Related U.S. Application Data

(62) Division of application No. 10/868,806, filed on Jun. 17, 2004, now Pat. No. 7,019,355.

(30) Foreign Application Priority Data

Sep. 30, 2003    (JP) .............................. 2003-342219

(51) Int. Cl.
*H01L 21/336* (2006.01)
(52) U.S. Cl. ..................... 438/258; 257/316
(58) Field of Classification Search ......... 438/257–267; 257/315–321
See application file for complete search history.

(56) References Cited

U.S. PATENT DOCUMENTS 5,679,591 A * 10/1997 Lin et al. .................... 438/257
6,191,444 B1   2/2001 Clampitt et al.
6,437,397 B1   8/2002 Lin et al.

FOREIGN PATENT DOCUMENTS

| JP | 2-275668 | 11/1990 |
|---|---|---|
| JP | 4-26162 | 1/1992 |
| JP | 4-87374 | 3/1992 |
| JP | 9-36258 | 2/1997 |
| JP | 10-199998 | 7/1998 |
| JP | 11-150251 | 6/1999 |
| JP | 2000-286350 | 10/2000 |
| JP | 2000-357784 | 12/2000 |
| JP | 3180714 | 4/2001 |
| KR | 2002-95355 | 12/2002 |
| KR | 2003-67824 | 8/2003 |

OTHER PUBLICATIONS

Korean Office Action (w/English Translation).

\* cited by examiner

*Primary Examiner*—David Vu
(74) *Attorney, Agent, or Firm*—Oblon, Spivak, McClelland, Maier & Neustadt, P.C.

(57) ABSTRACT

A nonvolatile semiconductor memory includes a plurality of memory cell transistors, having floating gates, control gates, and inter-gate insulating films each arranged between corresponding floating gate and corresponding control gate, respectively, and deployed along a column direction; and device isolation regions deployed at a constant pitch along a row direction making a striped pattern along the column direction. The control gates are continuously deployed along the row direction, and the inter-gate insulating films are in series along the column direction and separated from each other at a constant pitch along the row direction.

2 Claims, 25 Drawing Sheets

NONVOLATILE SEMICONDUCTOR MEMORY AND A FABRICATION METHOD THEREOF

CROSS REFERENCE TO RELATED APPLICATIONS

This application is a divisional of U.S. patent application Ser. No. 10/868,806, filed Jun. 17, 2004 now U.S. Pat. No. 7,019,355, which is based upon and claims the benefit of priority from prior Japanese Patent Applications P2003-342219 filed on Sep. 30, 2003; the entire contents of each of which are incorporated by reference herein.

BACKGROUND OF THE INVENTION

1. Field of the Invention

The present invention relates to an electrically erasable nonvolatile semiconductor memory (EEPROM) and a fabrication method thereof.

2. Description of the Related Art

An electrically erasable programmable read-only memory (EEPROM), which electrically performs data write-in and erasure, for example, has been known as a nonvolatile semiconductor memory (R. Shirota, 'A Review of 256 Mbit NAND Flash Memories and NAND Flash Future Trend', Nonvolatile Semiconductor Memory Workshop (NVSMW), 2000, p. 22-31). In such as EEPROM, especially a NAND type, a memory cell array is configured by deploying or locating memory cells at the respective intersections of horizontal word lines and vertical bit lines. A MOS transistor having a 'stacked gate structure' configured by stacking a floating gate (FG) and a control gate (CG), for example, is typically used as a memory cell.

It should be noted that Japanese Patent Application Laid-open No. 2002279788, for example, discloses a NAND cell-type EEPROM with certain structural characteristics. Memory cells are formed in each device region isolated by device isolation regions called shallow trench isolation (STI). Each memory cell has a stacked gate structure. Such a structure is characterized by an extended control gate used as a word line.

SUMMARY OF THE INVENTION

An aspect of the present invention inheres in a nonvolatile semiconductor memory including: (a) a plurality of memory cell columns, each of the memory cell column including a plurality of memory cell transistors, each having a floating gate, a control gate, and an inter-gate insulating film, the inter-gate insulating film is arranged between the floating gate and the control gate, the memory cell columns are arranged along a row direction; and (b) a plurality of device isolation regions arranged at a constant pitch along the row direction, each of the device isolation regions is implemented by a striped pattern extending along the column direction, (c) wherein the control gate is shared by the memory cell transistors arranged along the row direction, and the inter-gate insulating film is shared by the memory cell transistors arranged along the column direction and is separated from an adjacent inter-gate insulating film by one of the device isolation films.

Another aspect of the present invention inheres in a fabrication method of a nonvolatile semiconductor memory including: (a) forming a gate insulating film on a semiconductor substrate; (b) forming a floating gate film on the gate insulating film; (c) selectively removing a part of the floating gate film so as to define a plurality of floating gates; (d) depositing a first interlayer insulating film across the entire surface of the semiconductor substrate so as to fill a gap between the floating gates; (e) removing a part of the first interlayer insulating film so as to expose top surfaces of the floating gates by chemical polishing; (f) depositing an inter-gate insulating film on the top surfaces of the floating gates; (g) removing the inter-gate insulating film in an area other than a memory cell transistor area so as to expose the floating gate; (h) depositing a mask insulating film on the inter-gate insulating film and the exposed floating gate; (i) forming a device isolation trench in a region for device isolation; (j) depositing a buried insulating film across the entire surface of the semiconductor substrate including the device isolation trench; (k) removing the mask insulating film; (l) forming a control gate film on the inter-gate insulating film and the exposed floating gate; (m) selectively etching a part of the control gate film so as to define a plurality of control gates and to expose the inter-gate insulating film; (n) further depositing a second interlayer insulating film across the entire surface of the semiconductor substrate so as to fill a gap between the control gates; and (o) forming an isolation trench between the memory cell transistor area and a peripheral transistor area, (p) wherein the control gate is shared by a plurality of memory cell transistors arranged along a row direction, the inter-gate insulating film is shared by a plurality of memory cell transistors arranged along a column direction and is separated from an adjacent inter-gate insulating film by one of the device isolation trench.

Another aspect of the present invention inheres in a fabrication method of a nonvolatile semiconductor memory including: (a) forming a gate insulating film on a semiconductor substrate; (b) forming a floating gate film on the gate insulating film; (c) depositing a stopper film on the floating gate film; (d) selectively removing the stopper film and a part of the floating gate film so as to define a plurality of floating gates and to expose the gate insulating film; (e) depositing a first interlayer insulating film across the entire surface of the semiconductor substrate so as to fill a gap between the floating gates; (f) removing a part of the first interlayer insulating film so as to expose the stopper film by chemical polishing; (g) removing the stopper film so as to expose top surfaces of the floating gates by chemical polishing; (h) depositing an inter-gate insulating film on the top surfaces of the floating gate; (i) removing the inter-gate insulating film in an area other than a memory cell transistor area so as to expose the floating gate; (j) depositing a mask insulating film on the inter-gate insulating film and the exposed floating gate; (k) forming a device isolation trench in a region for device isolation; (l) depositing a buried insulating film across the entire surface of the semiconductor substrate including the device isolation trench; (m) removing the mask insulating film; (n) forming a control gate film on the inter-gate insulating film and the exposed floating gate film; (o) selectively etching a part of the control gate film so as to define a plurality of control gates and to expose the inter-gate insulating film; (p) further depositing a second interlayer insulating film across the entire surface of the semiconductor substrate so as to fill a gap between the control gates; and (q) forming an isolation trench between the memory cell transistor area and a peripheral transistor area, (r) wherein the control gate is shared by a plurality of memory cell transistors arranged along a row direction, the inter-gate insulating film is shared by a plurality of memory cell transistors arranged along a column direction and is separated from an adjacent inter-gate insulating film by one of the device isolation trench.

DETAILED DESCRIPTION OF THE EMBODIMENTS

Figure 1:
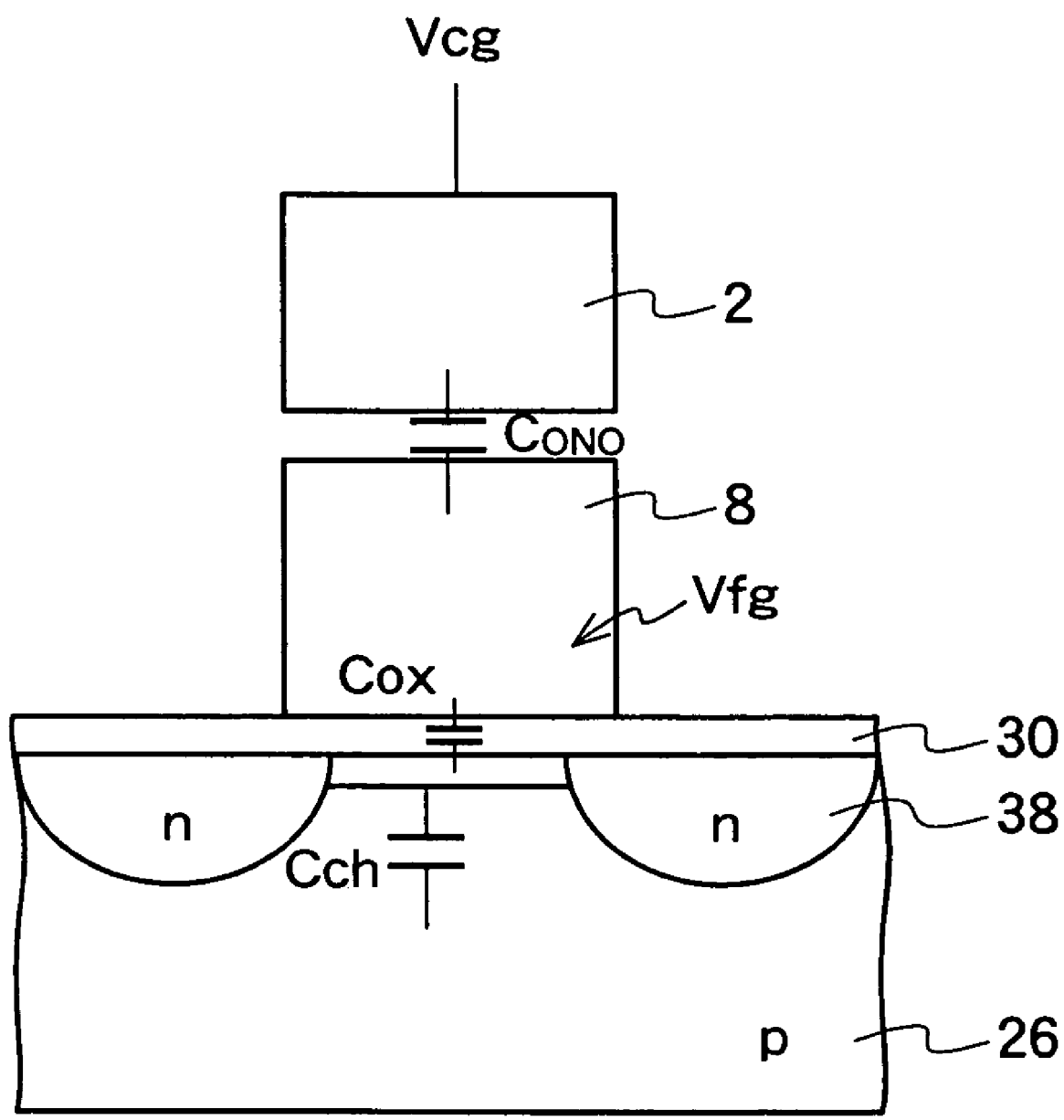
FIG. 1 is a schematic cross-sectional diagram of a memory cell transistor having a stacked gate structure of a comparative example.

The present invention provides a nonvolatile semiconductor memory and a fabrication method thereof. The fabrication method eliminates difficulties during the fabrication process, precisely fabricates a minute stacked gate structure of a memory cell transistor region, and easily forms peripheral transistors even when a floating gate layer is a thin film and when a film such as an alumina film, which is difficult to be dry etched, is used as an inter-gate insulating film.

The nonvolatile semiconductor memory of the present invention and the fabrication thereof eliminates difficulties in the fabrication process, and formation of a minute stacked gate structure with a good process yield. The process is effective even when a floating gate layer is a thin film or when a film such as an alumina film, which is difficult to be dry etched, is used as an inter-gate insulating film.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is relared art in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

A nonvolatile semiconductor memory, which includes multiple memory cell transistors including floating gates, control gates, and inter-gate insulating films arranged between corresponding floating gate and corresponding control gate, respectively. Device isolating regions with a striped pattern along the bit line length are arranged at a constant pitch along the word line length. The control gates are arranged in series along the word line length, and the inter-gate insulating films are arranged in series along the bit line length and are separated from each other at a constant pitch along the word line length. A method for fabrication of the device is also provided.

A plurality of word lines is located perpendicular to a plurality of bit lines. A word line length is located parallel to a row direction. A bit line length is located parallel to a column direction.

Embodiments of the present invention are described forthwith while referencing the drawings. The same or similar symbols are applied to the same or similar parts throughout the appended drawings. In addition, the embodiments given forthwith illustrate devices and methods for embodying the technical idea of the present invention, and that technical idea of the present invention is not limited to the following. The technical idea of the present invention may be modified within the scope of the appended claims.

COMPARATIVE EXAMPLE

A NAND flash EEPROM memory transistor, as shown in FIG. 1, has a multilayer stacked structure where diffusion layers 38, which functions a source or a drain region in a semiconductor substrate 26, are formed. A control gate 2 is provided and an electric charge accumulation layer, which is configured from a floating gate 8, are r stacked on the semiconductor substrate 26 via a first gate insulating film 30, which will function as a tunnel insulator film. In FIG. 1, $C_{ch}$ denotes the sum of the channel depletion layer capacitance and the diffusion layer junction capacitance of a single memory transistor. $C_{ox}$ denotes the capacitance between the floating gate of a single memory transistor and the semiconductor substrate. $C_{ONO}$ denotes the capacitance between the control gate and the floating gate of a single memory transistor. $V_{cg}$ denotes a control gate potential, and $V_{fg}$ denotes a floating gate potential. A NAND memory cell unit is configured by connecting multiple memory transistors in series as a column such that neighboring memory cells share either a common source or a common drain region. Select gate transistors are arranged at both sides thereof.

Figure 2:
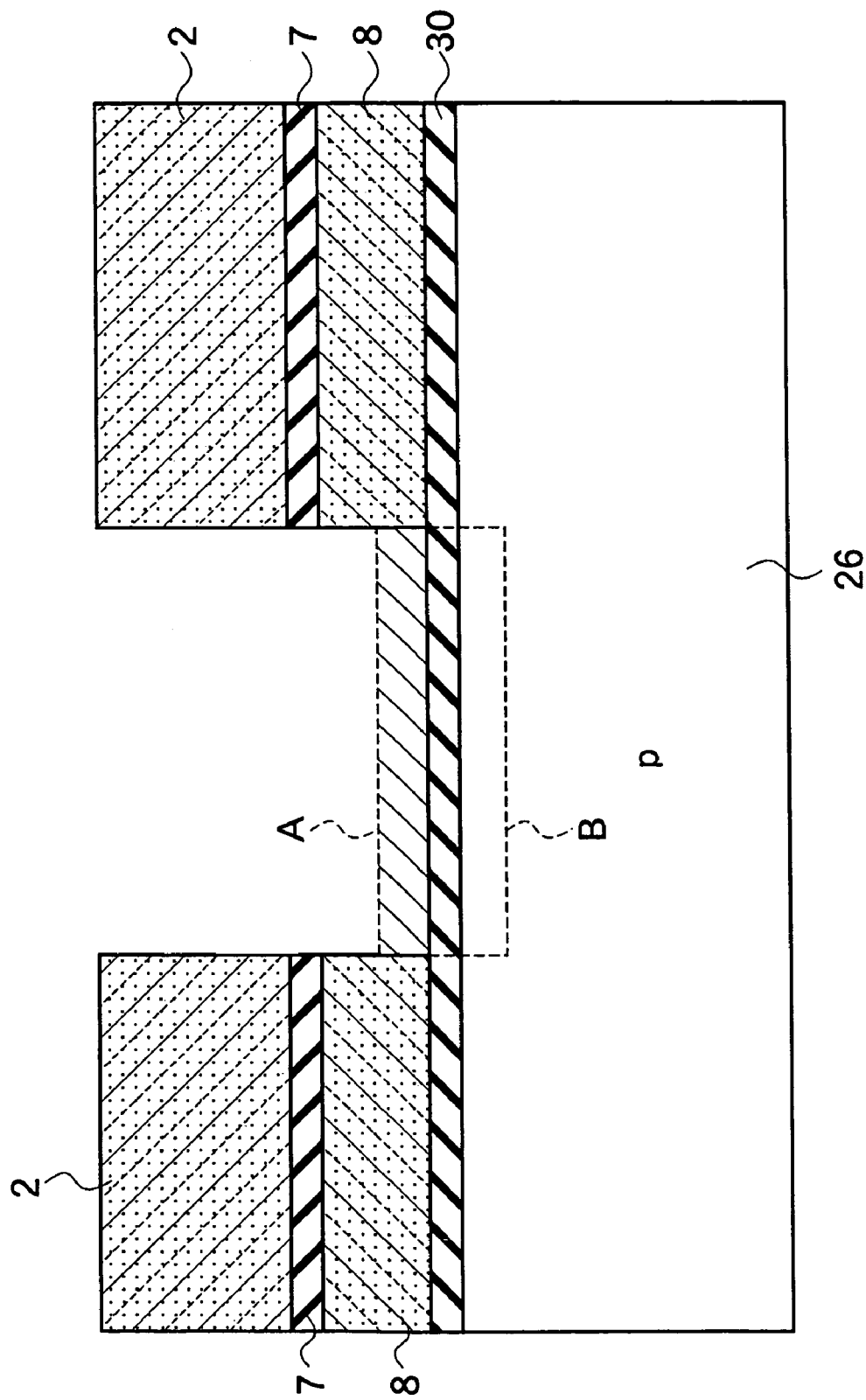
FIG. 2 is a diagram for describing problems when forming a GC stacked structure of a comparative example.

Comparative example problems exist in the fabrication process of the multilayer stacked structure (CG stack) configured from the semiconductor substrate 26, the floating gates 8, inter-gate insulating films such as alumina films 7, and the control gates 2, as shown in FIG. 2. For example, etching of the inter-gate insulating film 7 is stopped at the floating gate 8, at the gate insulating film 30 in the dry etch processing when forming a memory cell transistor or a select gate transistor. Subsequently, highly selective etching of an oxide film made of the gate insulating film 30 is necessary. For example, the etched surface must stop at the surface A in FIG. 2. However, stopping the etching at the floating gate 8 is extremely difficult when using such dry etching, because the floating gate 8 continuely become thinner. In certain cases there is concern that the etched surface will reach the silicon (Si) semiconductor substrate 26 as surface B in FIG. 2 indicates. This creates a problem for precision processing, especially, a memory cell transistor or a select gate transistor. Another problem is to ensure proper operating characteristics of a memory cell transistor or a select gate transistor when using an insulator film made of a material, such as an alumina ($Al_2O_3$) film that is difficult to etch, as the inter-gate insulating film 7.

When a floating gate layer is a thin film or in addition, when a film such as an alumina film, which is difficult to dry-etch, is used as an inter-gate insulating film, it is difficult to stop etching on the gate insulating film during processing of the GC stack.

First Embodiment

The structure of the nonvolatile semiconductor memory according to an embodiment of the present invention is characterized in that the floating gates 8 and the control gates 2 of the GC stacked structure are formed separately, as compared to the comparative example.

The first embodiment of the present invention is further characterized by the inter-gate insulating film 7 in only the device isolation regions (STI) of the memory cell transistor area being dry-etched. In other words, the present invention is characterized in that the inter-gate insulating film 7 is dry-etched only dry-etched areas in which STIs are formed for the device isolation regions 28, thereby preventing difficulties in the method of stopping etching for the GC stack at a gate insulating film, for example, stopping etching at a polysilicon surface for the floating gate 8.

The first embodiment of the present invention is further characterized by the control gates 2 connected in series along the word line WL length parallel to the row direction.

The first embodiment of the present invention is yet further characterized by a very simplified structure formed by providing the inter-gate insulating films 7 connected to each other in a layered form along the bit line BL length. The films are arranged between corresponding control gate 2 that configures the word lines WL and corresponding floating gate 8 that acts as an electric charge accumulation layer or the like.

Such characteristics of the nonvolatile semiconductor memory according to the embodiments of the present invention become evident through processing of the GC stack when creating the stacked gate structure. Accordingly, since the characteristics become evident by describing the fabrication method, the fabrication processs will be described first.

Figure 3:
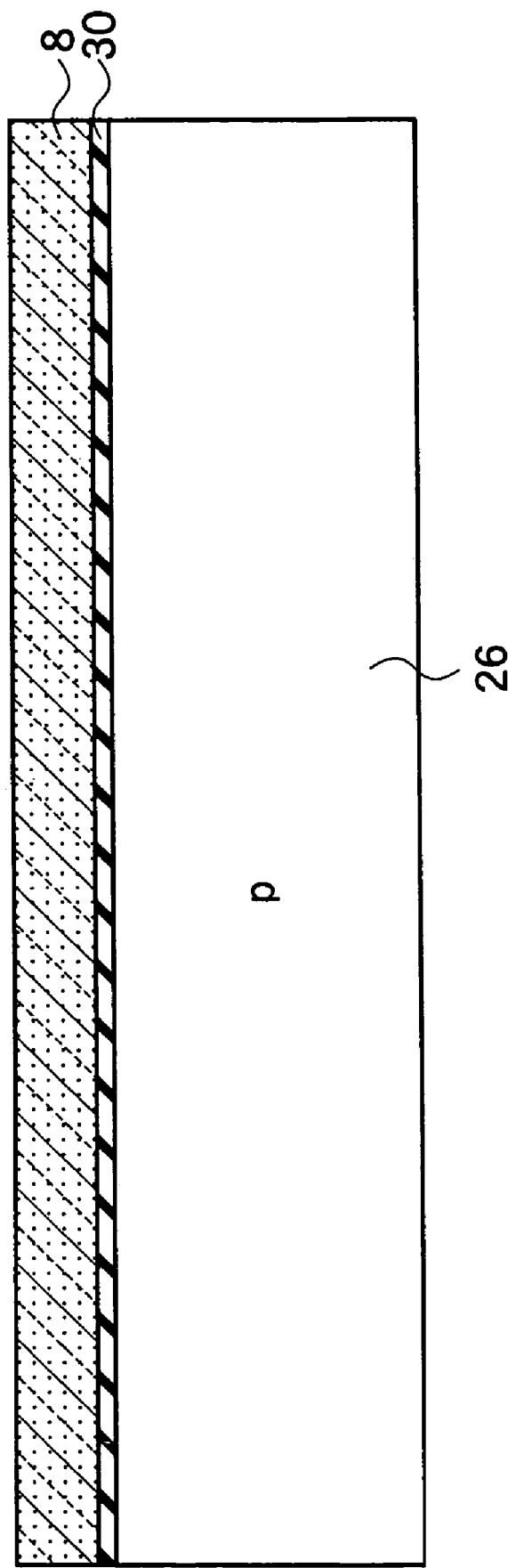
FIG. 3 is a schematic cross-sectional diagram illustrating a process of a nonvolatile semiconductor memory fabrication method according to an first embodiment of the present invention.

(a) To begin with, as shown in FIG. 3, after oxidizing a gate area in the p-well or the semiconductor substrate 26 for forming the gate insulating film (tunnel oxide film) 30 for a memory cell transistor or a select gate transistor, a polysilicon layer for the floating gates 8 is formed.

Figure 4:
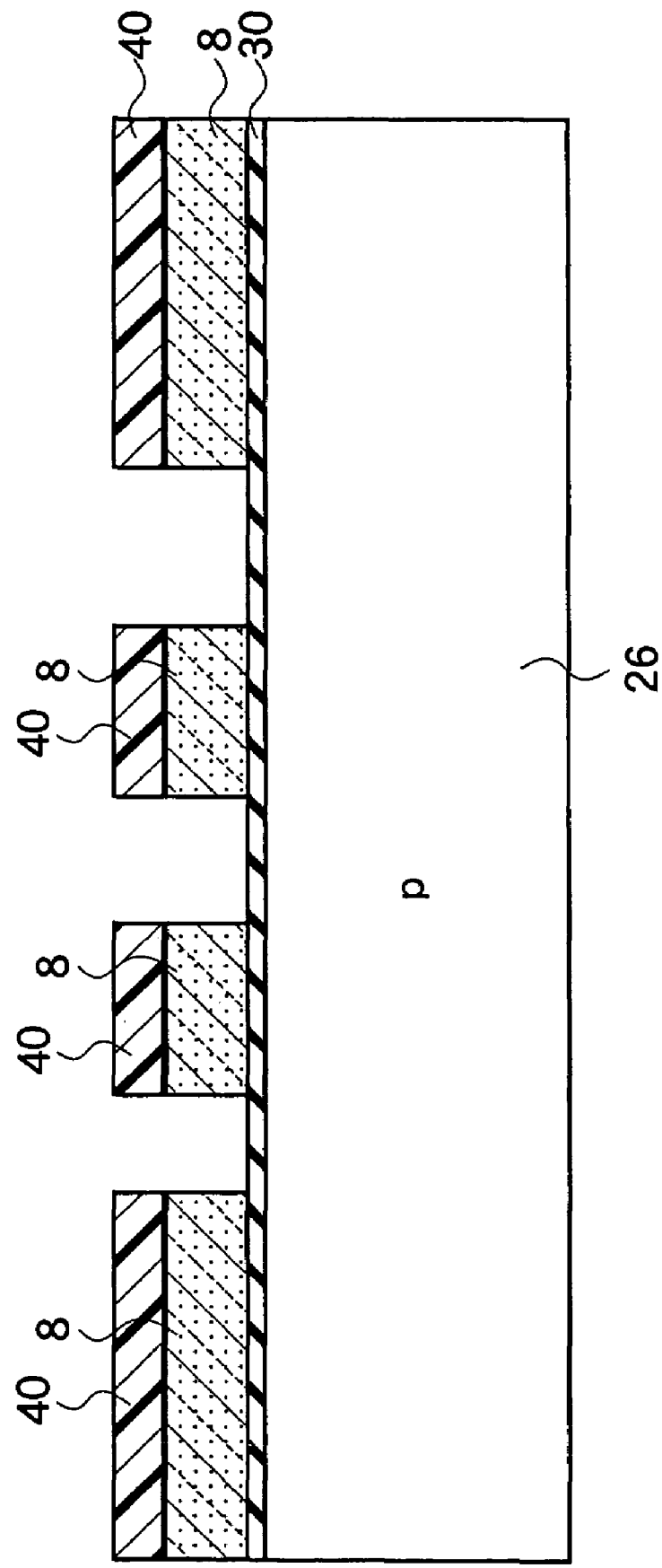
FIG. 4 is a schematic cross-sectional diagram illustrating a process of the nonvolatile semiconductor memory fabrication method according to the first embodiment of the present invention.

(b) As shown in FIG. 4, once a resist 40 is applied and then patterned, dry etching is performed, selectively removing the polysilicon layer for the floating gates 8.

Figure 5:
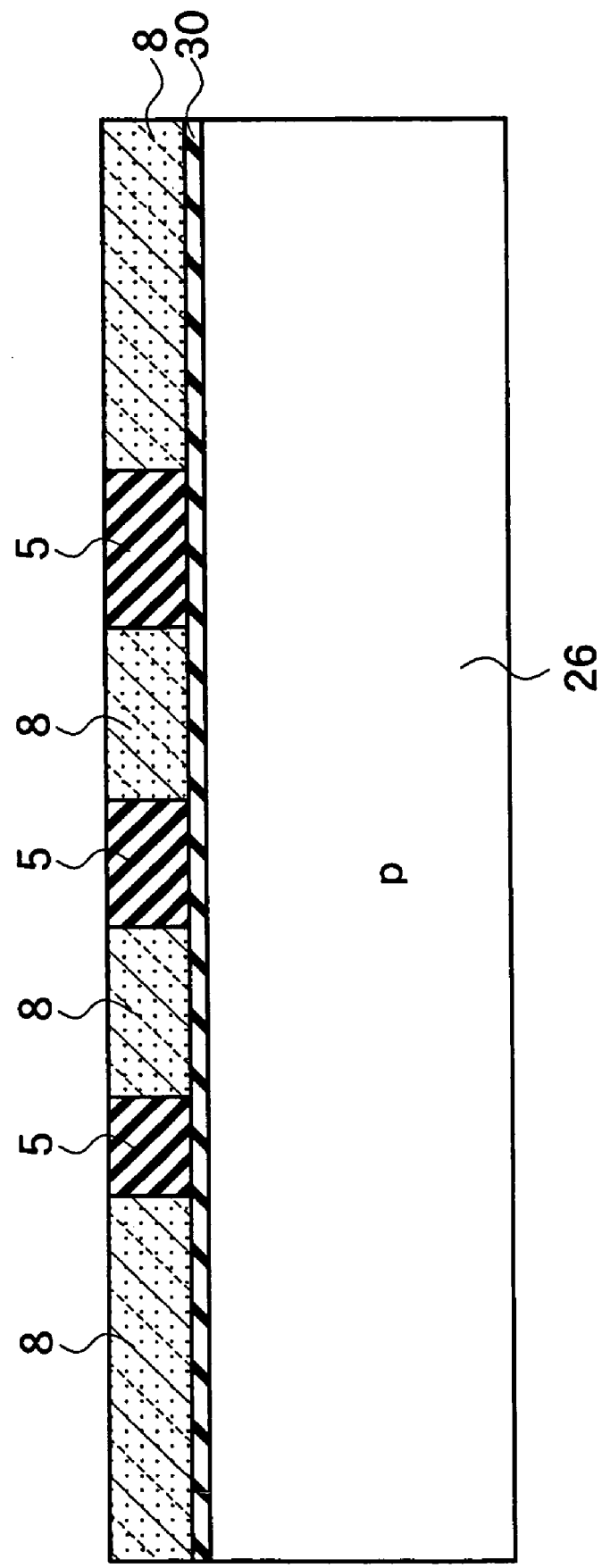
FIG. 5 is a schematic cross-sectional diagram illustrating a process of the nonvolatile semiconductor memory fabrication method according to the first embodiment of the present invention.

(c) As shown in FIG. 5, once the resist 40 is removed, a tetraethoxydisilane (TEOS) film is deposited as a first interlayer insulating film 5 across the entire surface of the device. The first interlayer insulating film 5 is polished and planarized by a chemical mechanical polishing (CMP) technique until the polysilicon layer for the floating gates 8 is exposed.

In this case, a structure substantially the same as the structure shown in FIG. 5 may also be implemented using fabrication processs described forthwith and FIG. 6 to FIG. 9 corresponding thereto.

Figure 6:
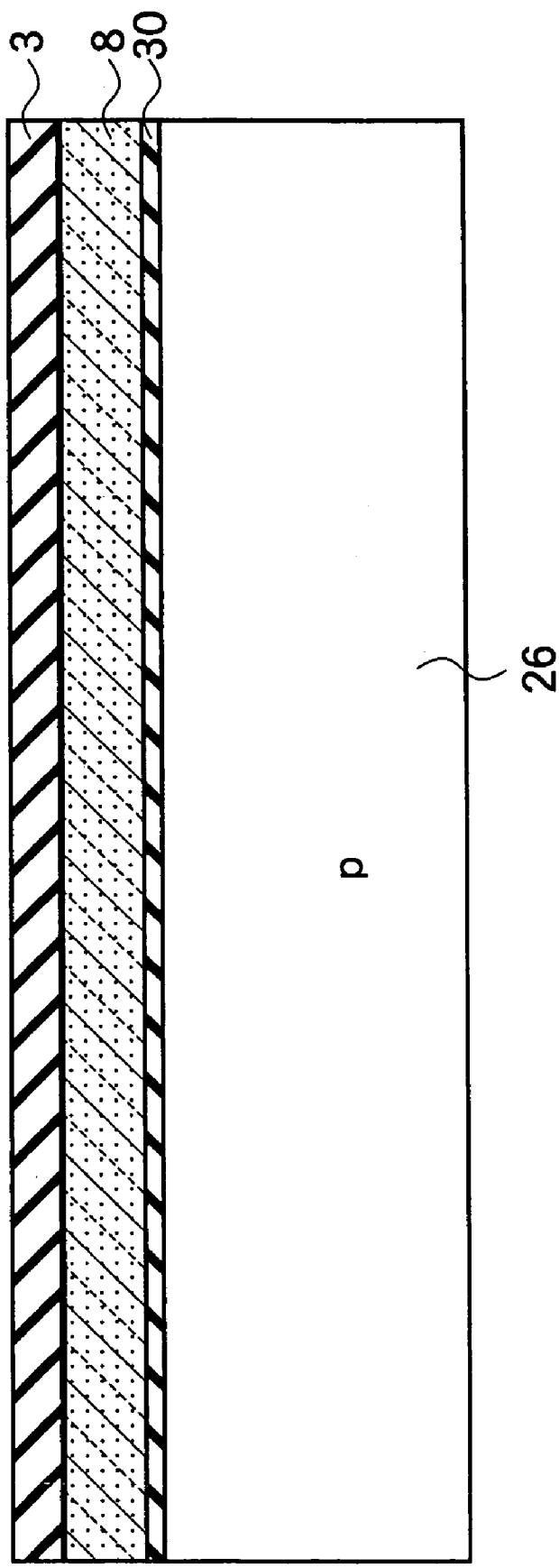
FIG. 6 is a schematic cross-sectional diagram illustrating a process of the nonvolatile semiconductor memory fabrication method according to the first embodiment of the present invention.
Figure 7:
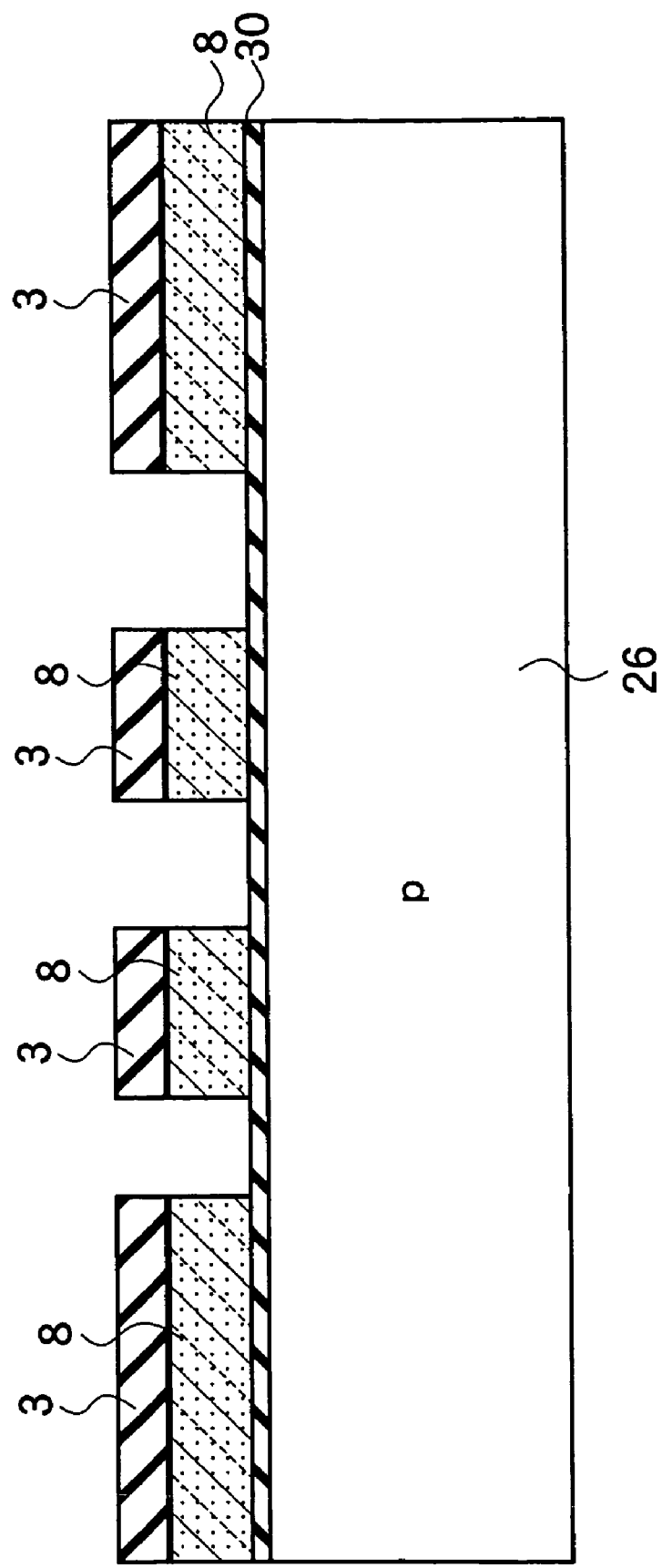
FIG. 7 is a schematic cross-sectional diagram illustrating a process of the nonvolatile semiconductor memory fabrication method according to the first embodiment of the present invention.

(2a) To begin with, as shown in FIG. 6, once the gate insulating film 30 is formed, a polysilicon layer for the floating gates 8 and a stopper film 3 that becomes a CMP stopper are deposited. The CMP stopper film 3 is preferably a material that can form the thinnest film, and can be easily removed in the subsequent wet etching processes. Thereafter, the floating gates 8 are patterned and the polysilicon layer for the floating gates 8 is selectively removed (FIG. 7).

Figure 8:
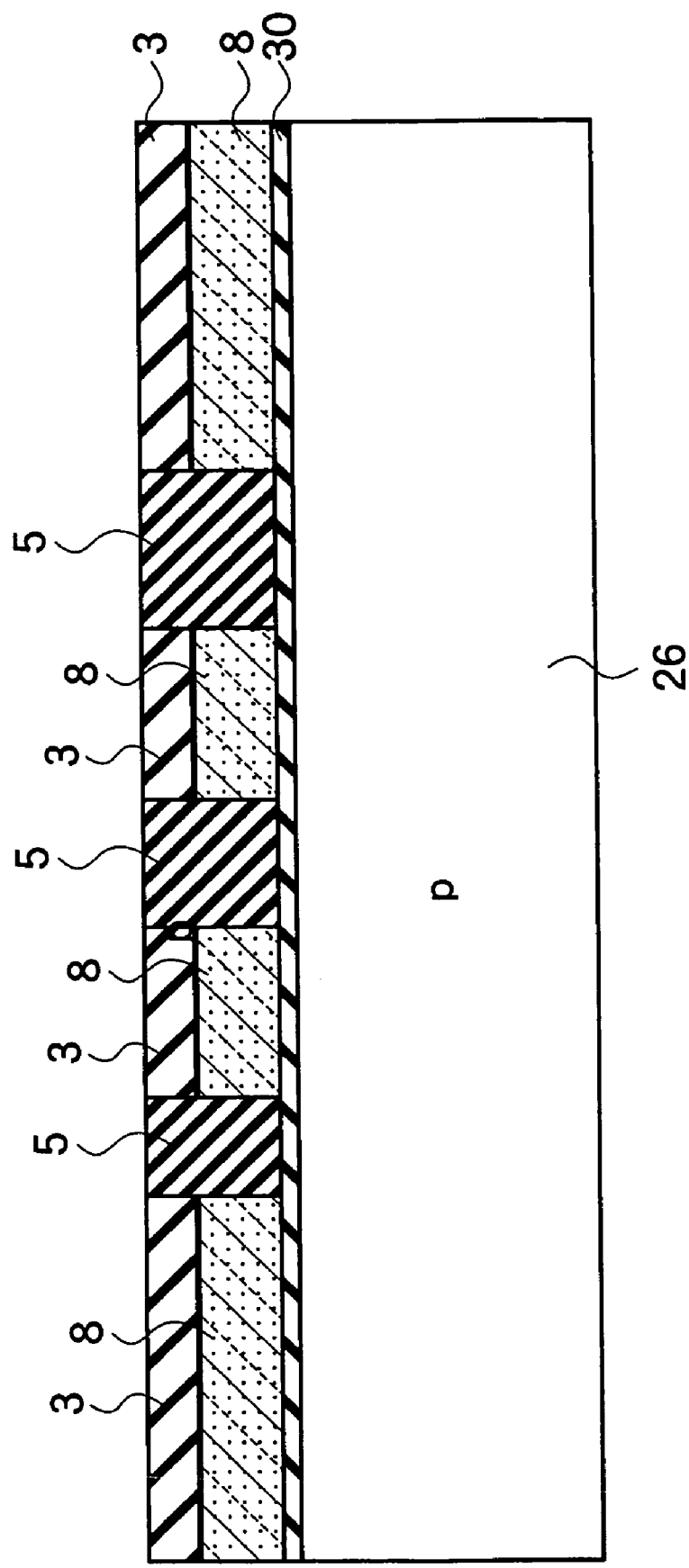
FIG. 8 is a schematic cross-sectional diagram illustrating a process of the nonvolatile semiconductor memory fabrication method according to the first embodiment of the present invention.

(2b) As shown in FIG. 8, the first interlayer insulating films 5 such as TEOS films, for example, are buried between the floating gates 8 and then planarized by CMP.

Figure 9:
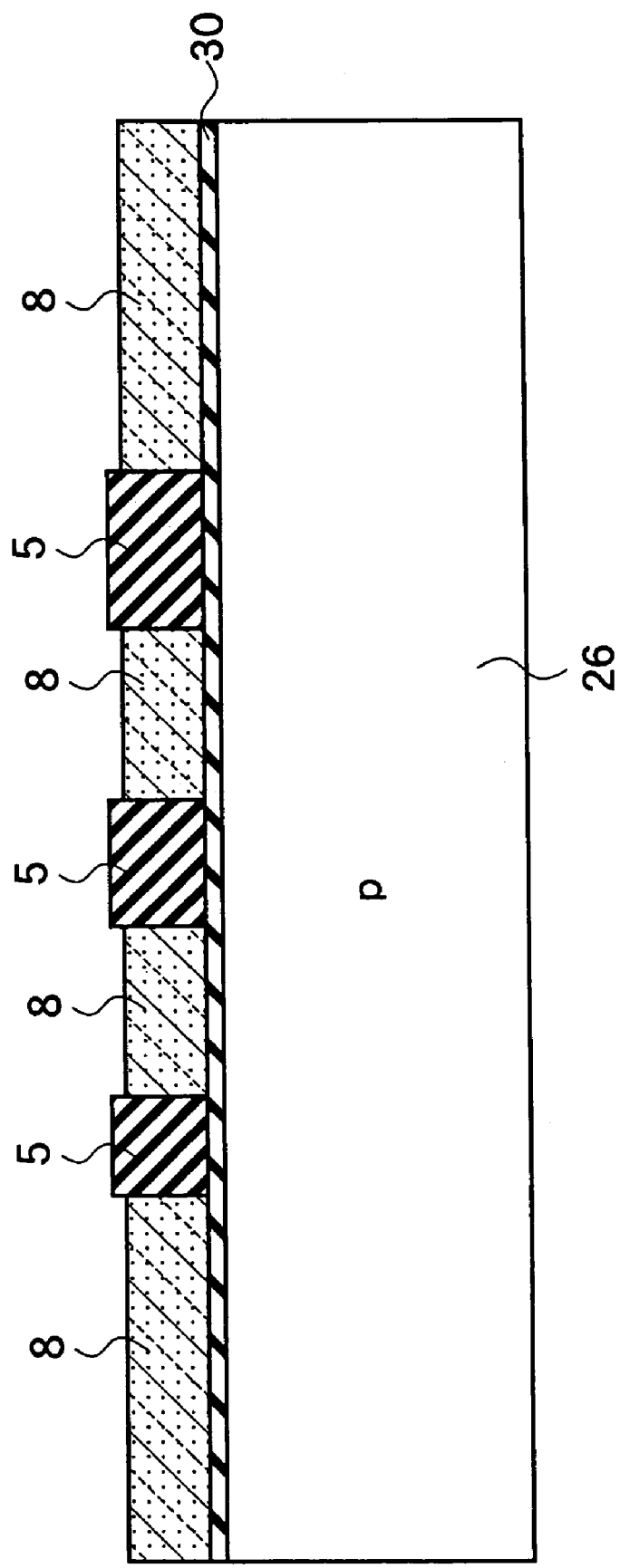
FIG. 9 is a schematic cross-sectional diagram illustrating a process of the nonvolatile semiconductor memory fabrication method according to the first embodiment of the present invention.

(2c) The stopper film is then removed as shown in FIG. 9. In FIG. 9, the difference in thickness of the floating gates 8 and the first interlayer insulating films 5 such as TEOS films is due to the difference in etching rate when wet etching to remove the stopper film 3. The difference in thickness is extremely small, and the structure of FIG. 5 and that of FIG. 9 are substantially the same. The following processes that continue from FIG. 5 are described.

Figure 10:
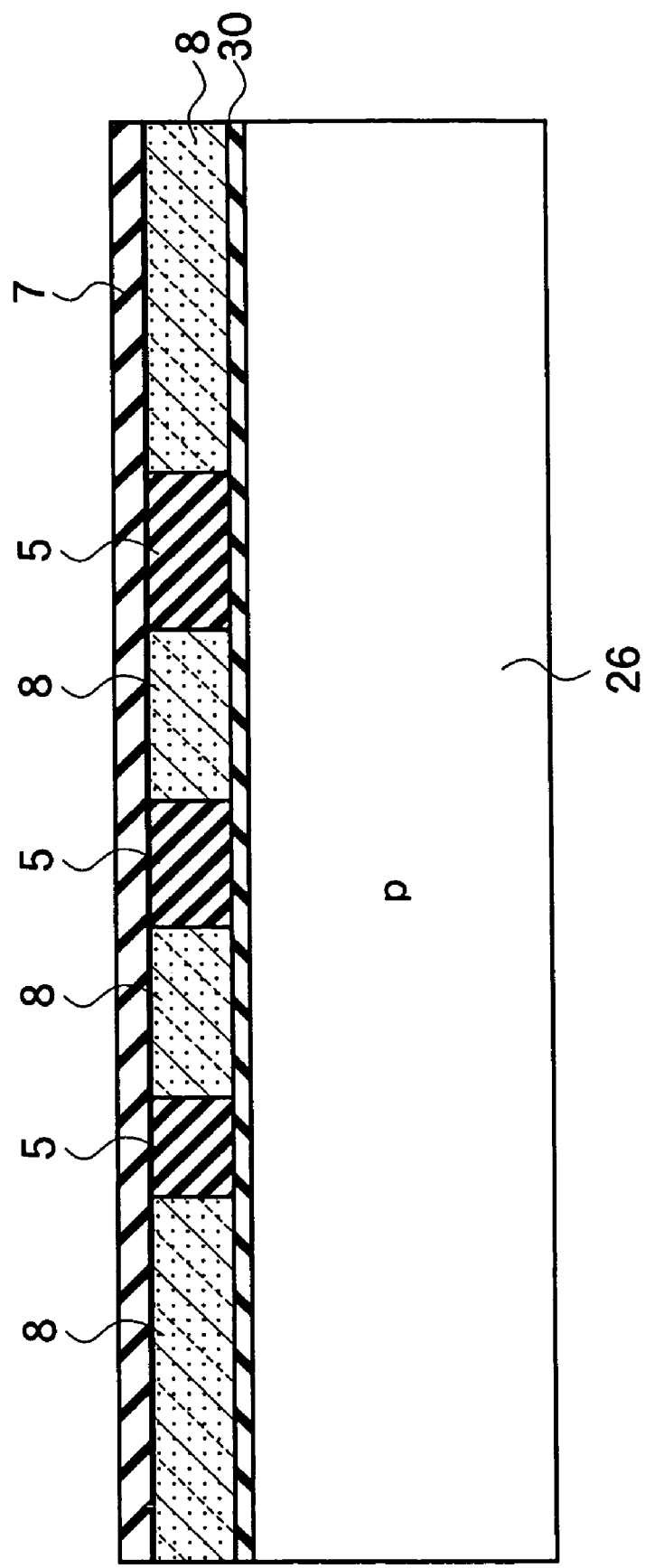
FIG. 10 is a schematic cross-sectional diagram illustrating a process of the nonvolatile semiconductor memory fabrication method according to the first embodiment of the present invention.

(d) As shown in FIG. 10, deposition of an inter-gate insulating film made from an alumina film 7 or the like is performed. It should be noted that the inter-gate insulating film 7 may have a structure including not only an aluminum oxide such as the alumina film or the like, but also may have a structure of a single layer or a multiple layered film made of a hafnium oxide, silicon oxide, silicon nitride and/or zirconium oxide.

Figure 11:
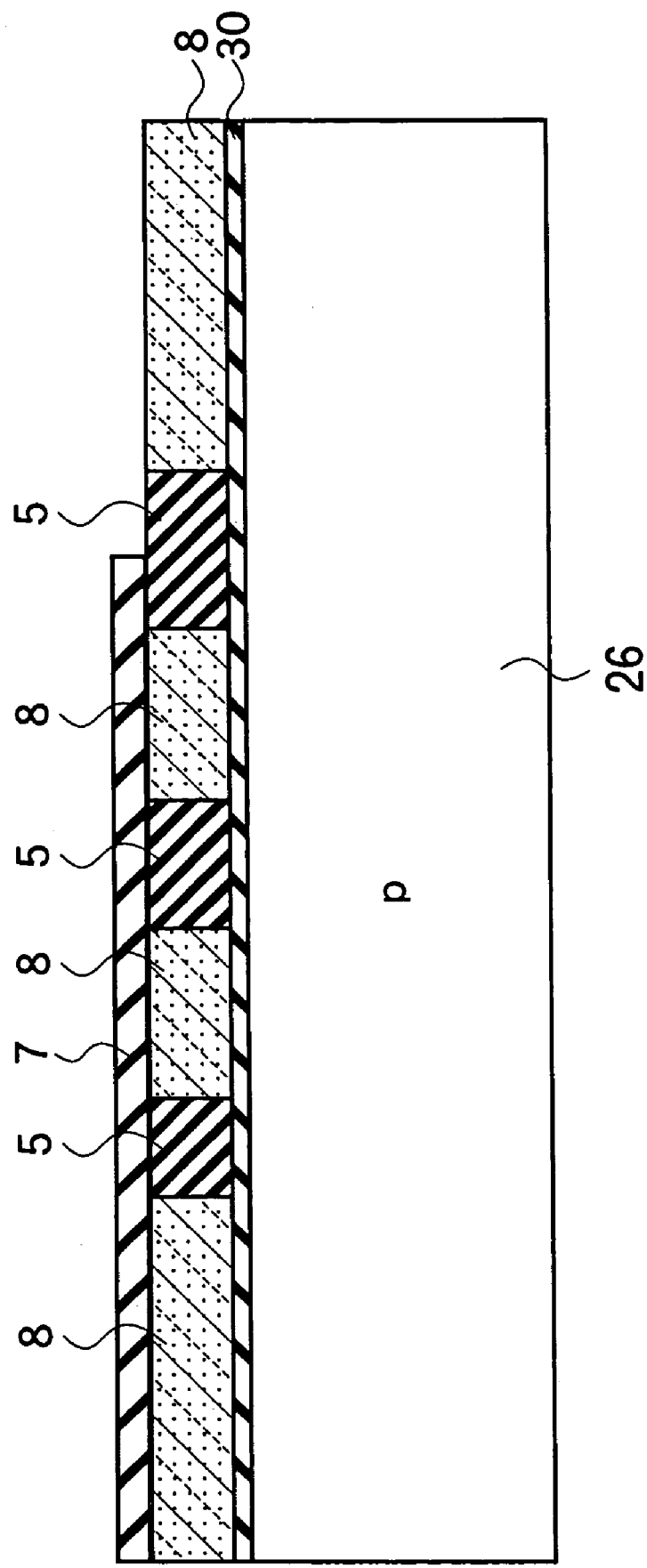
FIG. 11 is a schematic cross-sectional diagram illustrating a process of the nonvolatile semiconductor memory fabrication method according to the first embodiment of the present invention.

(e) As shown in FIG. 11, the inter-gate insulating film 7 of the peripheral transistor area and the select gate transistor area other than the memory cell transistor area is removed by wet etching or the like.

Figure 12:
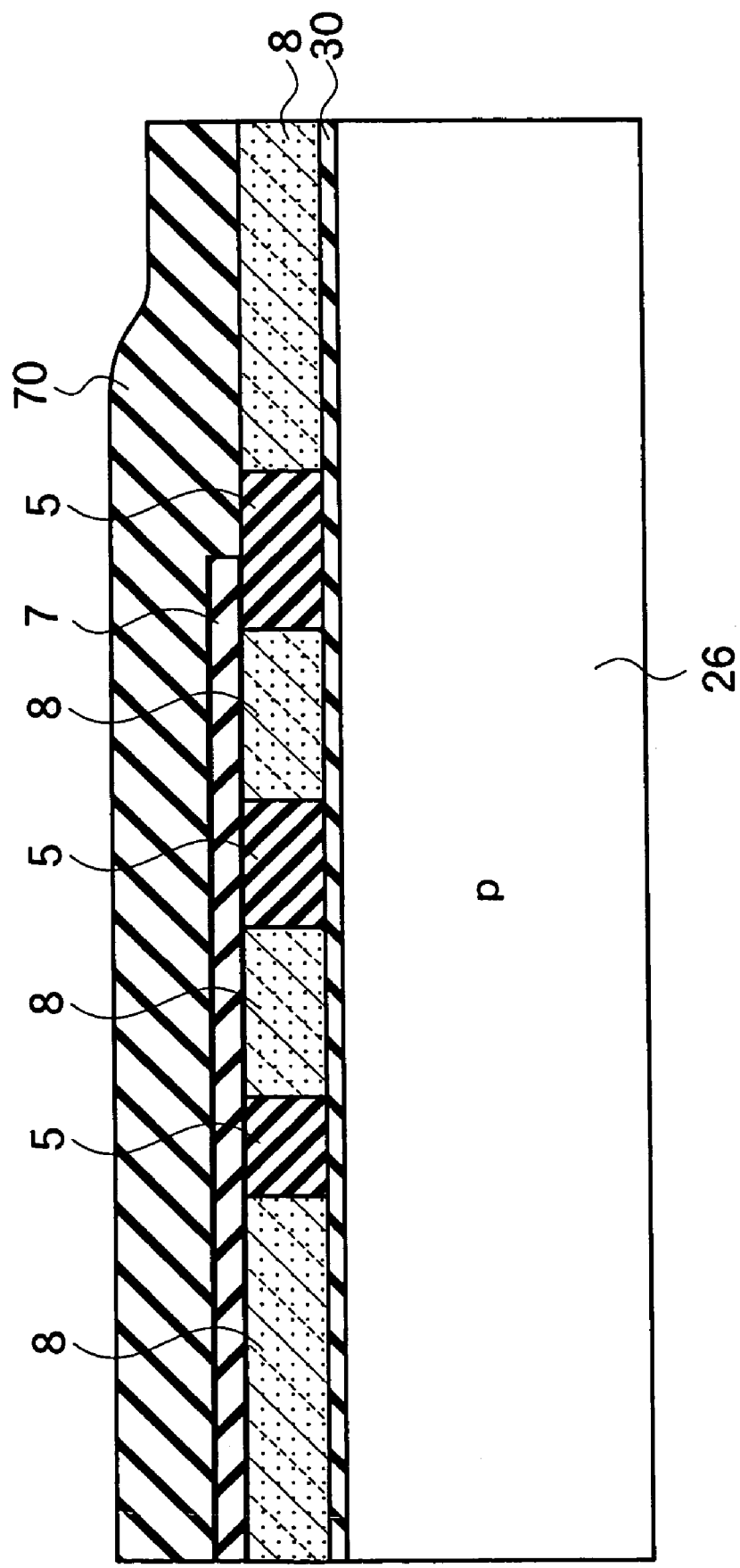
FIG. 12 is a schematic cross-sectional diagram illustrating a process of the nonvolatile semiconductor memory fabrication method according to the first embodiment of the present invention.

(f) As shown in FIG. 12, a mask insulating film 70 such as a nitride film or the like is deposited across the entirety. The mask insulating film 70 must have high selectivity for wet etching against a buried insulating film for STI 28 embedding described later.

Figure 13:
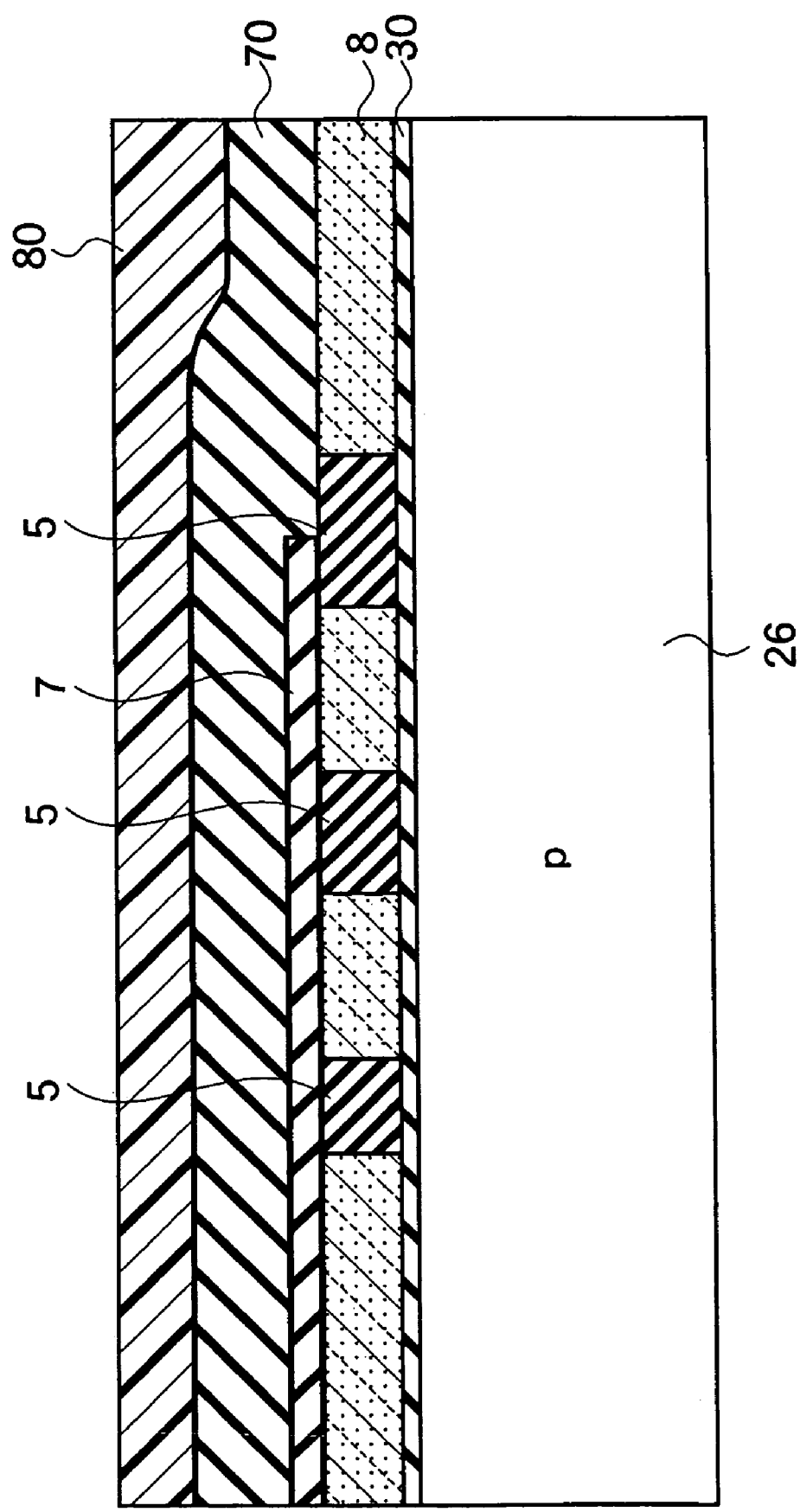
FIG. 13 is a schematic cross-sectional diagram illustrating a process of the nonvolatile semiconductor memory fabrication method according to the first embodiment of the present invention.

(g) A resist 80 is then applied as shown in FIG. 13. Furthermore, after patterning, dry etching is performed for creating an STI structure as shown in FIG. 19 and FIG. 20, or FIG. 22 and FIG. 23 described later, and the buried insulating film such as a TEOS film for embedding the STI area is then deposited across the entire surface of the device, including device isolation (STI) trenches.

Figure 14:
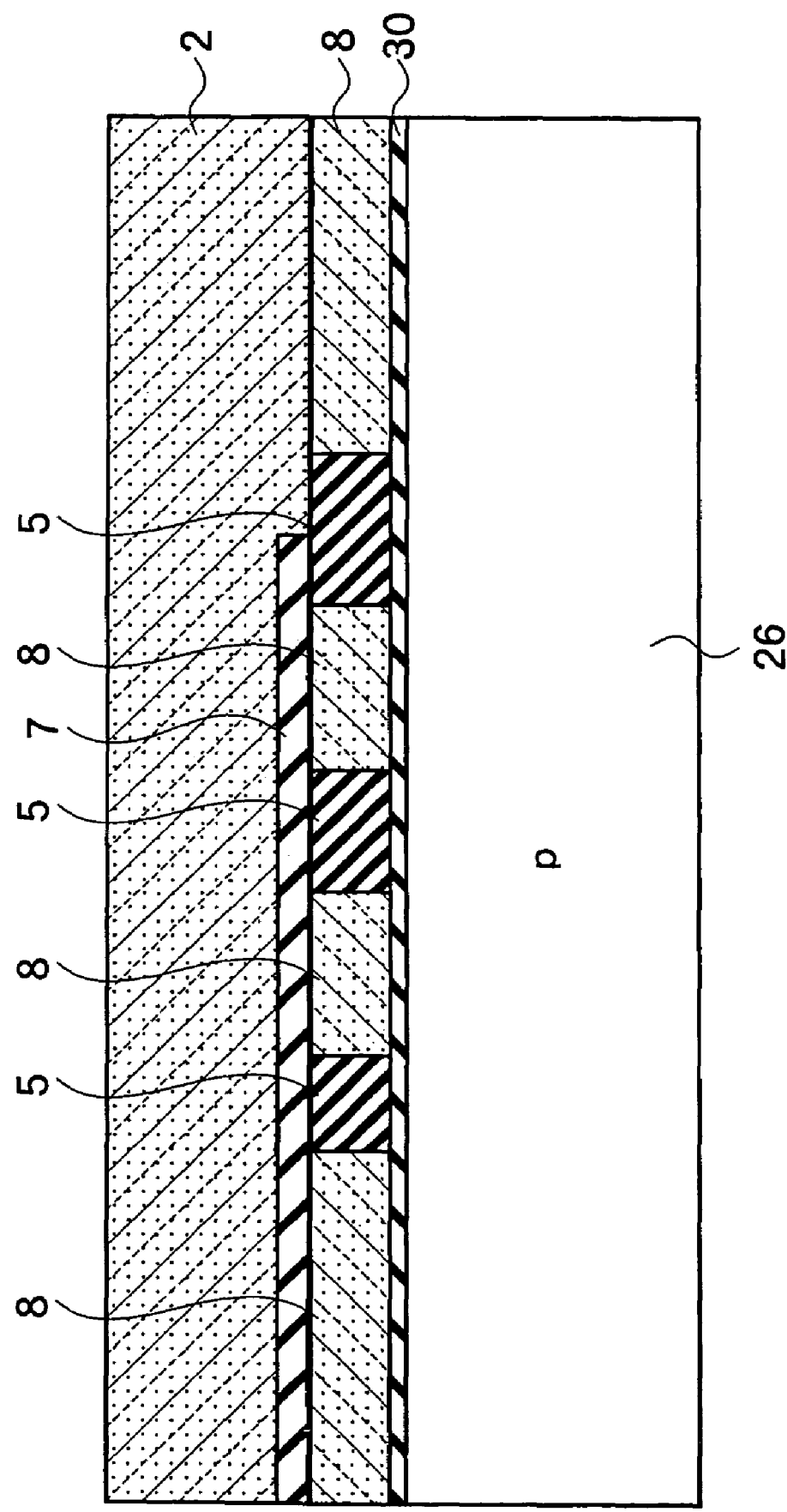
FIG. 14 is a schematic cross-sectional diagram illustrating a process of the nonvolatile semiconductor memory fabrication method according to the first embodiment of the present invention.
Figure 19:
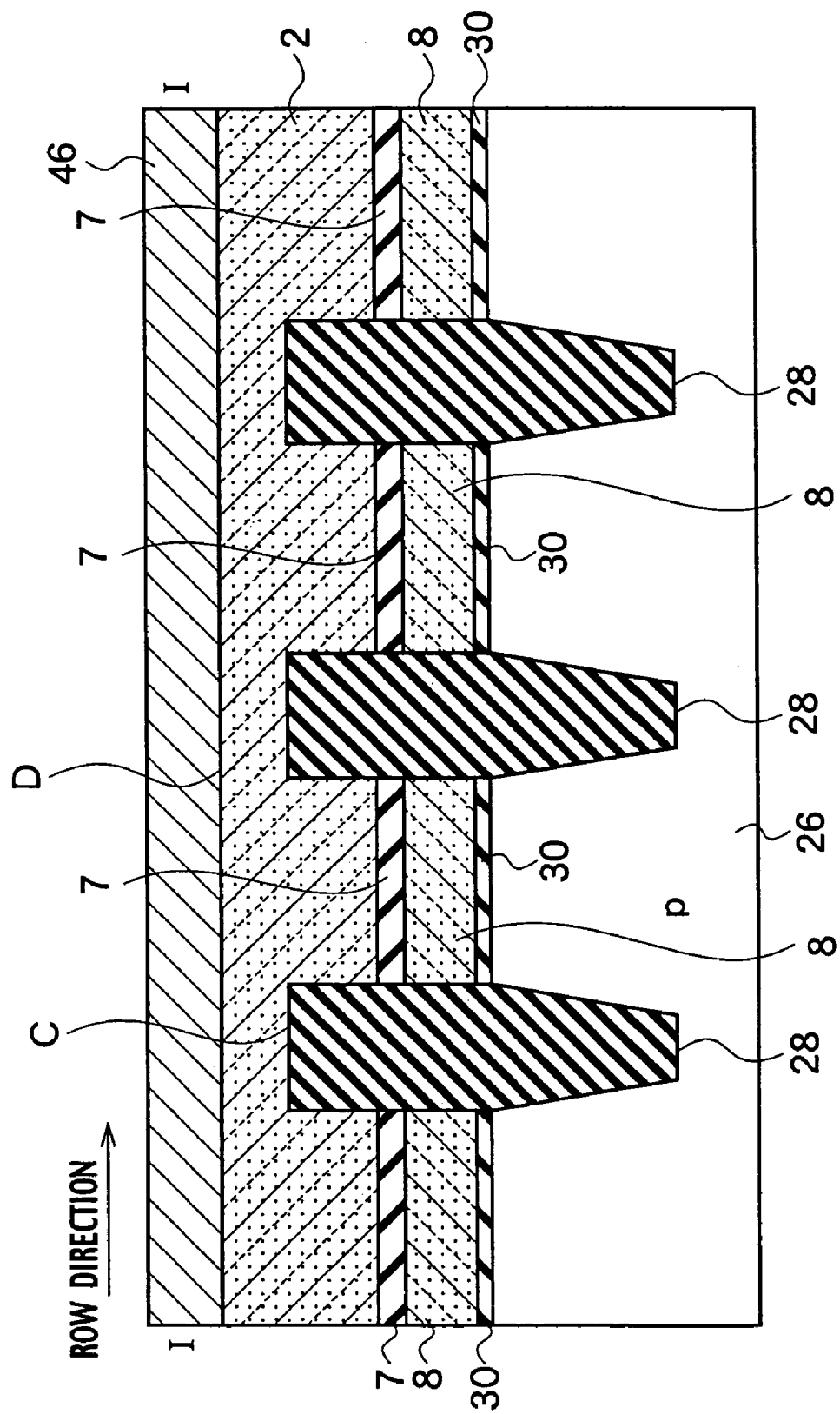
FIG. 19 is a schematic cross-sectional diagram cut along the line I-I of FIG. 18.
Figure 20:
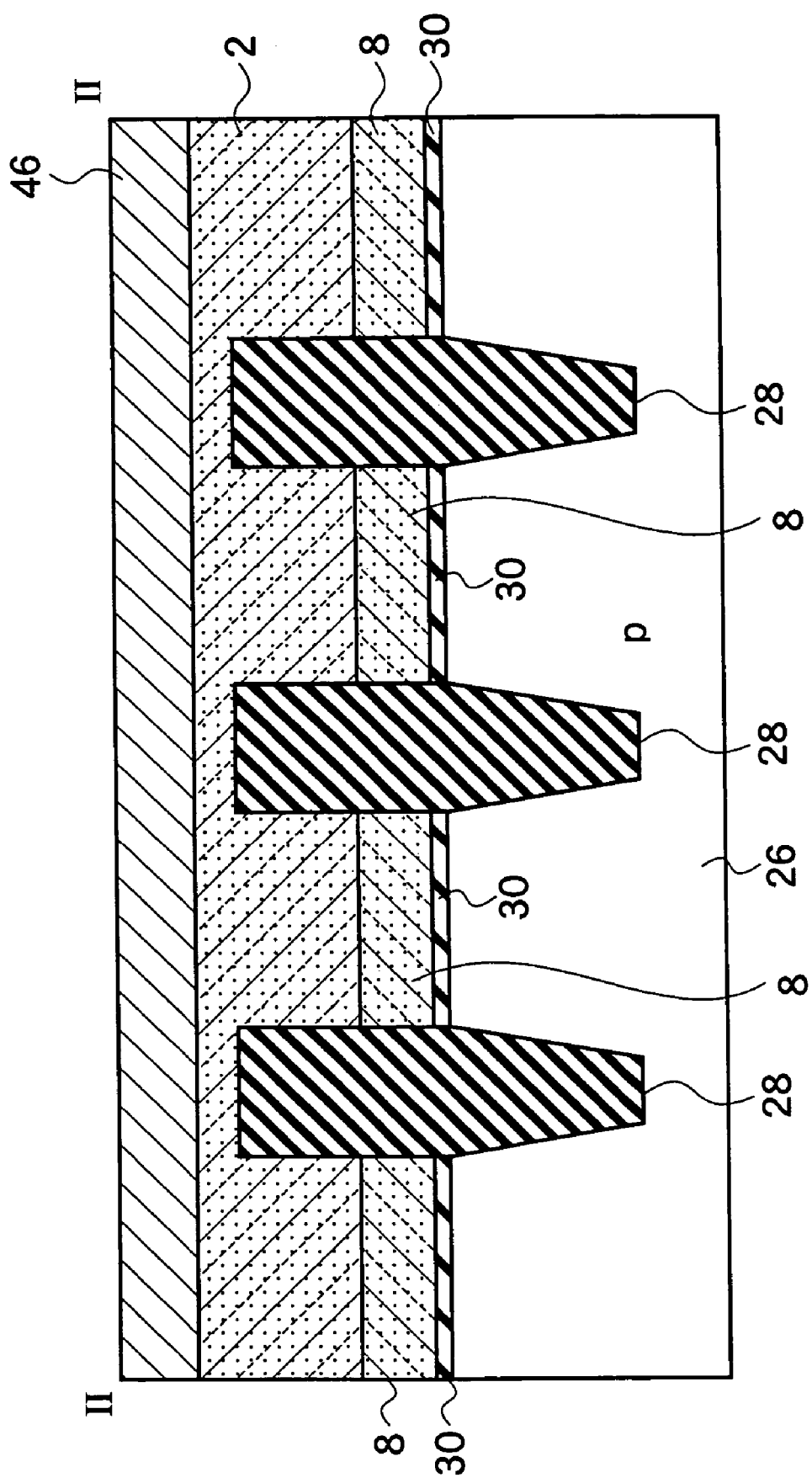
FIG. 20 is a schematic cross-sectional diagram cut along the line II-II of FIG. 18.

(h) As shown in FIG. 14, the mask insulating film 70, such as the nitride film used as a mask material, is removed and polysilicon for the control gate 2 is deposited. It is important for this thick polysilicon film to be deposited to a level higher than the top surface of device isolation regions 28 (FIG. 19 and FIG. 20). It should be noted that the material forming the control gate 2 is not limited to polysilicon. A configuration including a stacked layer of one or multiple types of titan, tungsten, or titan nitride may be employed. This configuration is advantageous in terms of miniaturization compared to polysilicon in that it can be easily formed to be thin and have low resistance.

Figure 15:
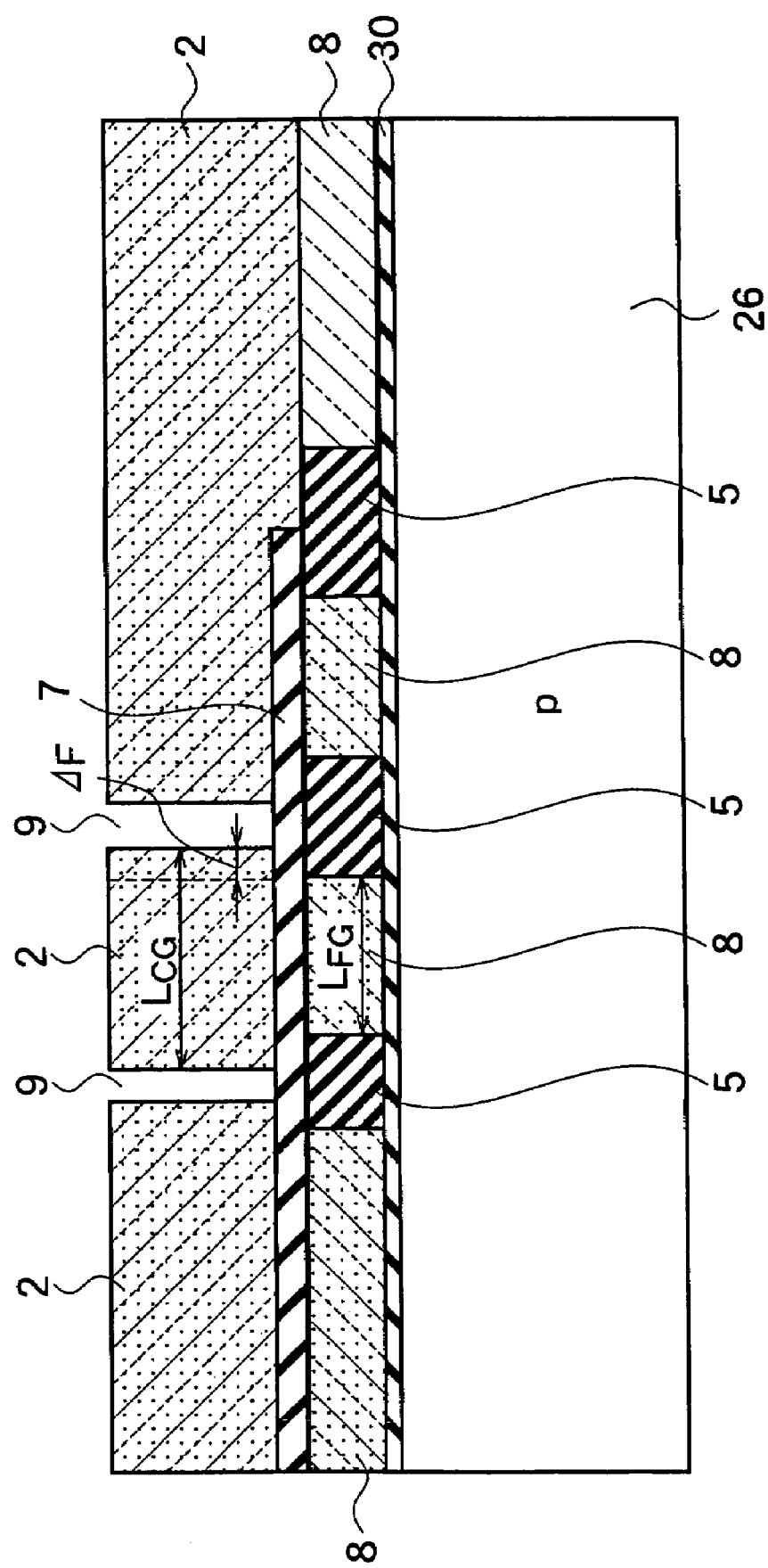
FIG. 15 is a schematic cross-sectional diagram illustrating a process of the nonvolatile semiconductor memory fabrication method according to the first embodiment of the present invention.

(i) As shown in FIG. 15, the control gates 2 are patterned so as to be separated, and etching trenches 9 are formed by dry etching or the like. The polysilicon for the control gates 2 is etched until the top surface of the inter-gate insulating film 7.

Width $L_{CG}$ of the control gate 2 and width $L_{FG}$ of corresponding floating gate 8, as shown in FIG. 15, need not always completely match. Width $L_{CG}$ of the control gate 2 and width $L_{FG}$ of corresponding floating gate 8 differ due to an etch margin $\Delta F$ for etching the polysilicon for the control gates 2. Naturally, the control gate 2 and the floating gate 8 may be formed with equal dimensions. The parasitic capacitance and withstand voltage between neighboring control gates 2 are problems when width $L_{CG}$ of the control gate 2 is greater than width $L_{FG}$ of corresponding floating gate 8. Additionally the coupling capacitance between each control gate 2 and corresponding floating gate 8 becomes small when width $L_{CG}$ of the control gate 2 is smaller than width $L_{FG}$ of corresponding floating gate 8; thus controllability of the memory cell transistors based on the control gates 2 decreases. Accordingly, an appropriate dimensional relationship exists. Specifically, the dimensional relationship should be set such that mutual interference between adjacent control gates may be controlled, and the controllability of the memory cell transistors based on the control gates 2 does not become a problem.

Figure 16:
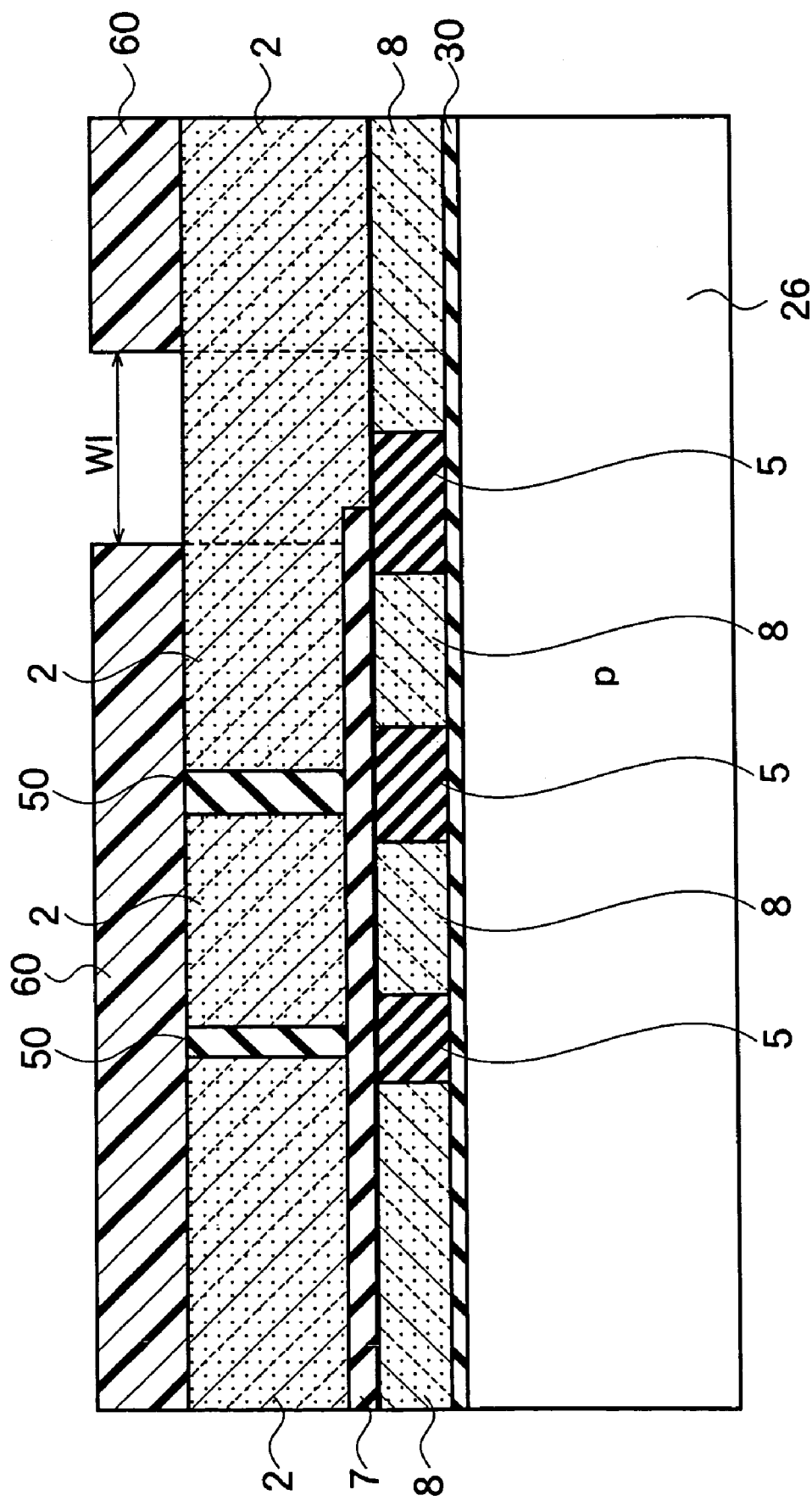
FIG. 16 is a schematic cross-sectional diagram illustrating a process of the nonvolatile semiconductor memory fabrication method according to the first embodiment of the present invention.

(j) A second interlayer insulating film 50 such as TEOS film is deposited, filling in the etching trenches 9, and the resulting surface is then planarized by CMP or the like. Furthermore, once a resist 60 is applied and patterned, width WI for an isolating trench 10 between the memory transistor area and the select gate transistor or between the memory transistor area and peripheral transistor is defined (FIG. 16).

Figure 17:
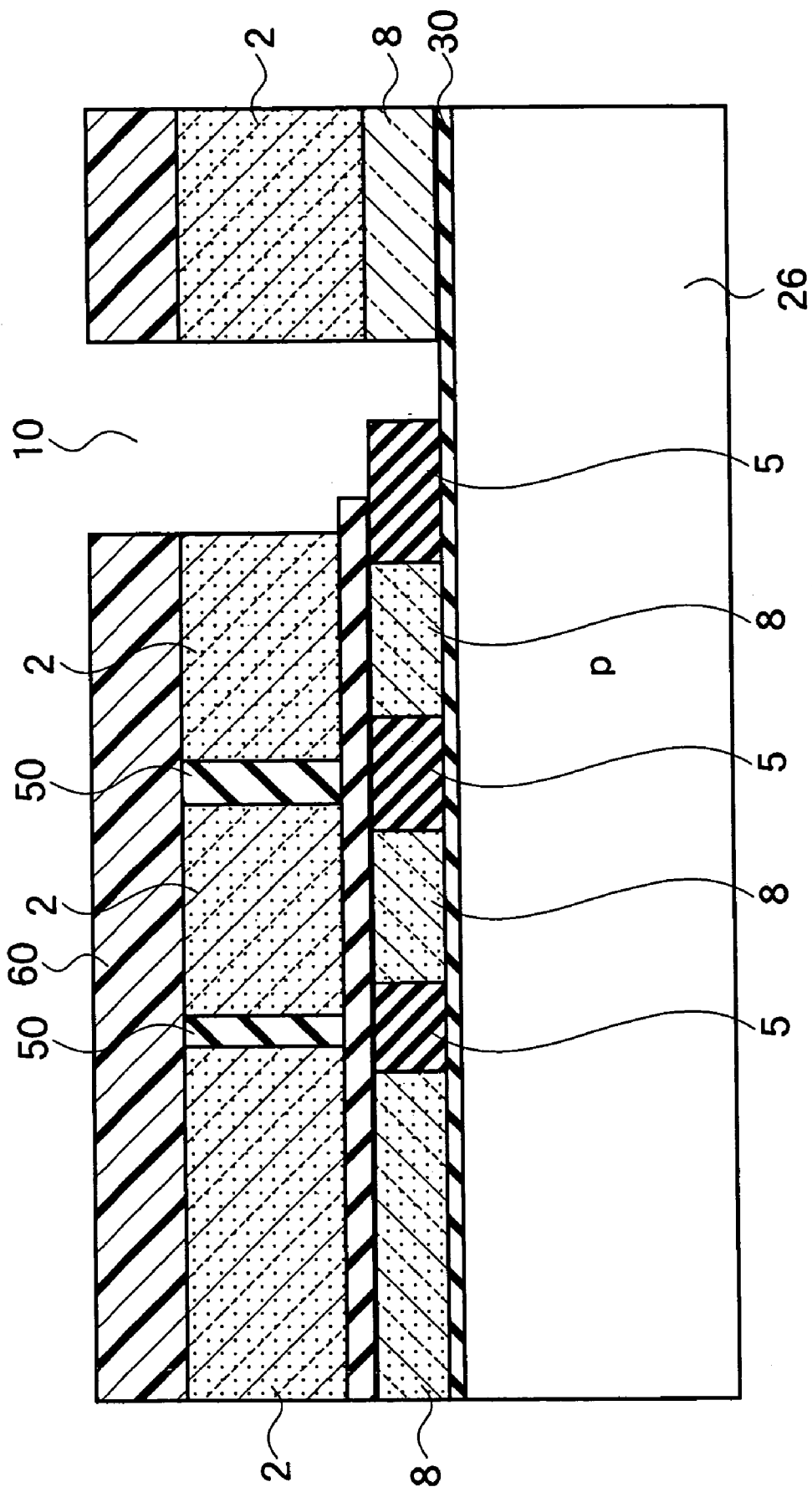
FIG. 17 is a schematic cross-sectional diagram illustrating a process of the nonvolatile semiconductor memory fabrication method according to the first embodiment of the present invention.

(k) As shown in FIG. 17, a part of the polysilicon for the control gates 2 and a part of the polysilicon for the floating gates 8 are removed by dry etching or the like so as to form the isolating trench 10 between the memory cell transistor and the select gate transistor or between the memory cell transistor and the peripheral transistor.

Figure 18:
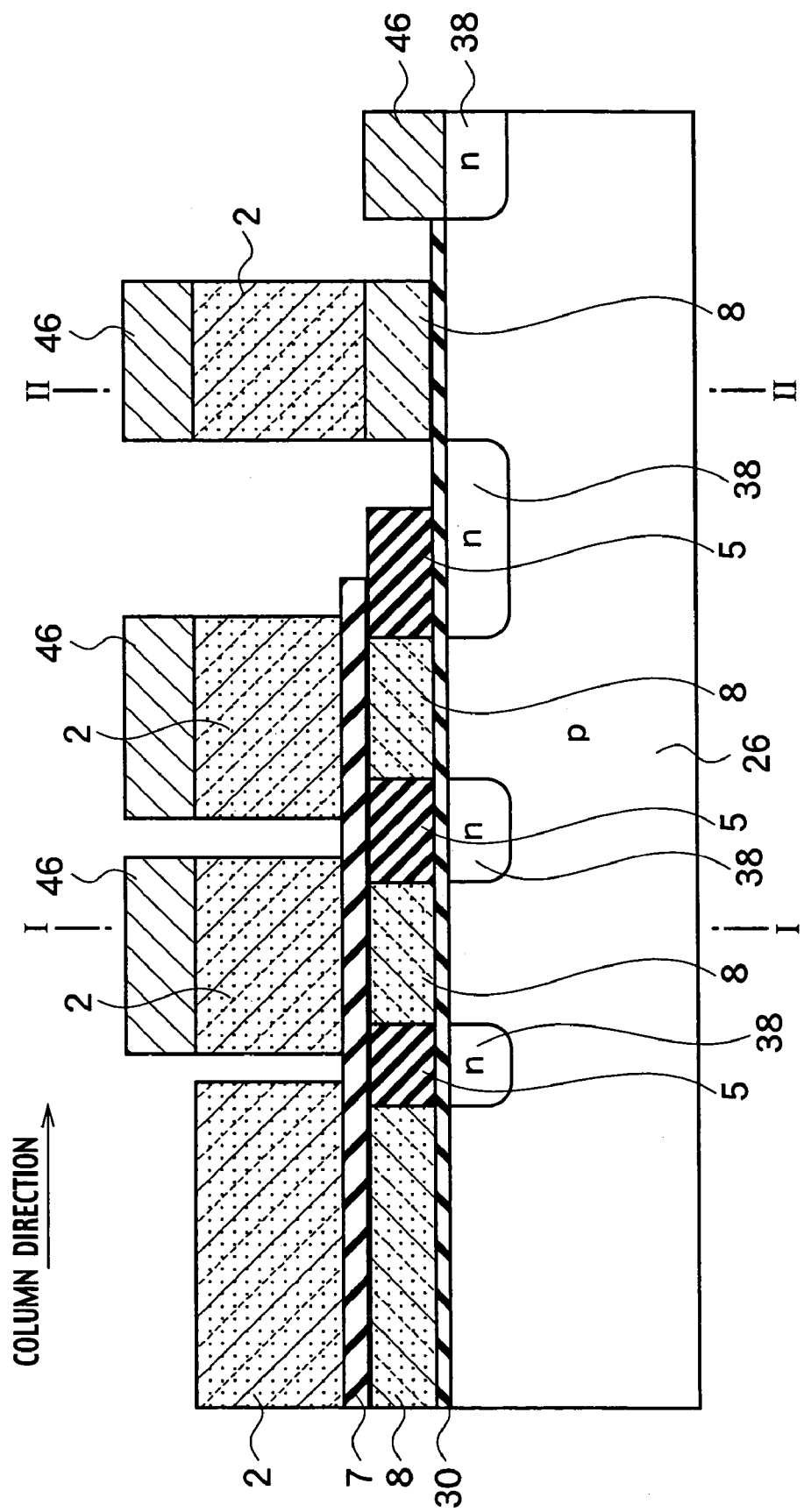
FIG. 18 is a schematic cross-sectional diagram of a nonvolatile semiconductor memory according to the first embodiment of the present invention.

The exemplary device structure of the nonvolatile semiconductor memory according to the first embodiment of the present invention, having become evident from the above fabrication method, is described referencing FIG. 18 to FIG. 20.

(Device Structure)

The structure shown in FIG. 17 allows low resistivity control gates 2 of the memory cell transistors using a salicide process, which forms metallic silicide on the polysilicon layer and applies a heat treatment thereto. FIG. 18 shows a structure with silicide films 46 formed on the control gates 2 of the memory cell transistors, the gates (2) of the select gate transistors or peripheral transistors, and the semiconductor substrate 26, which can decrease resistance. The control gates 2 with a salicide structure includes a silicide film 46 made of a metal, such as titan, cobalt or nickel. A silicide film made of a metal such as tungsten, platinum, molybdenum or erbium may be alternatively employed.

FIG. 18 schematically shows a partial structure of the memory cell transistors and the select gate transistors with the NAND structure, and corresponds to a cross-sectional structure cut along the length of the bit line BL. The source and the drain regions of the memory cell transistors and of the select gate transistors are both formed with diffusion layers 38. In FIG. 18, the direction of the device cross-section cut along the line I-I is in the word line WL direction in which a control gate 2 extends. In addition, the direction of the device cross-section cut along the line II-II is one, is in the select gate line direction arranged in parallel to the word line WL in which the gate of the select gate transistor extends.

The schematic device cross-section cut along the line I-I of FIG. 18 is shown in FIG. 19, and the schematic device cross-section cut along the line II-II is shown in FIG. 20. As is apparent from FIG. 19, the control gate 2 is linearly arranged as a single unit along the word line WL length parallel to the row direction. Furthermore, the floating gate 8 of each memory cell transistor is isolated by device isolating regions 28. Between the control gate 2 and the floating gates 8 are inter-gate insulating films 7 made of, for example, alumina, and between the floating gates 8 and the semiconductor substrate 26 are gate insulating films 30. The device isolating regions 28 are structured by STI, for example. As shown in FIG. 19, by forming the surface of the device isolating regions 28 lower than the surface of the control gate 2, the control gate 2 may be arranged along the word line WL length parallel to the row direction as a common region. In other words, the structure is characterized by the height of the surface of the device isolating regions 28 being lower than the height of the surface of the control gate 2. Here, the height of the surface of the device isolating regions 28 means the height of top surface C of the device isolating regions 28, which are formed by filling in the control gate 2, when measured from the surface of the semiconductor substrate 26 in FIG. 19. Furthermore, the height of the surface of the control gate 2 means the height of top surface D of the control gate 2 measured from the surface of the semiconductor substrate 26, and in the case of FIG. 19, corresponds to the height of the side that touches the silicide film 46 and the control gate 2. As shown in FIG. 19 or FIG. 20, the surface of the device isolating regions 28 is set lower than the surface of the control gate 2 and higher than the floating gates 8 or the inter-gate insulating films 7. The inter-gate insulating films 7 are isolated by the device isolating regions 28, as shown in FIG. 19. The device isolating regions 28 are arranged with a striped form along the bit line BL length parallel to the column direction, and are also arranged at a constant pitch along the word line WL length parallel to the row direction. Accordingly, the control gate 2 is continuously arranged as a single unit along the length of word line WL. Furthermore, the inter-gate insulating films 7 are arranged in a continuously layered form along length of bit line BL parallel to the column direction as shown in FIG. 18, and are characterized by the arrangement made at a constant pitch along the length of word line WL parallel to the row direction as shown in FIG. 19. FIG. 20 also shows the same structure, which is an example allowing formation of a gate electrode (2) of a select gate transistor made of the same material as that of the control gate 2 of the memory cell transistor, as a common select gate line in the select gate transistors or the peripheral transistors.

(Circuit Structure 1)

(NAND Structure)

Figure 21:
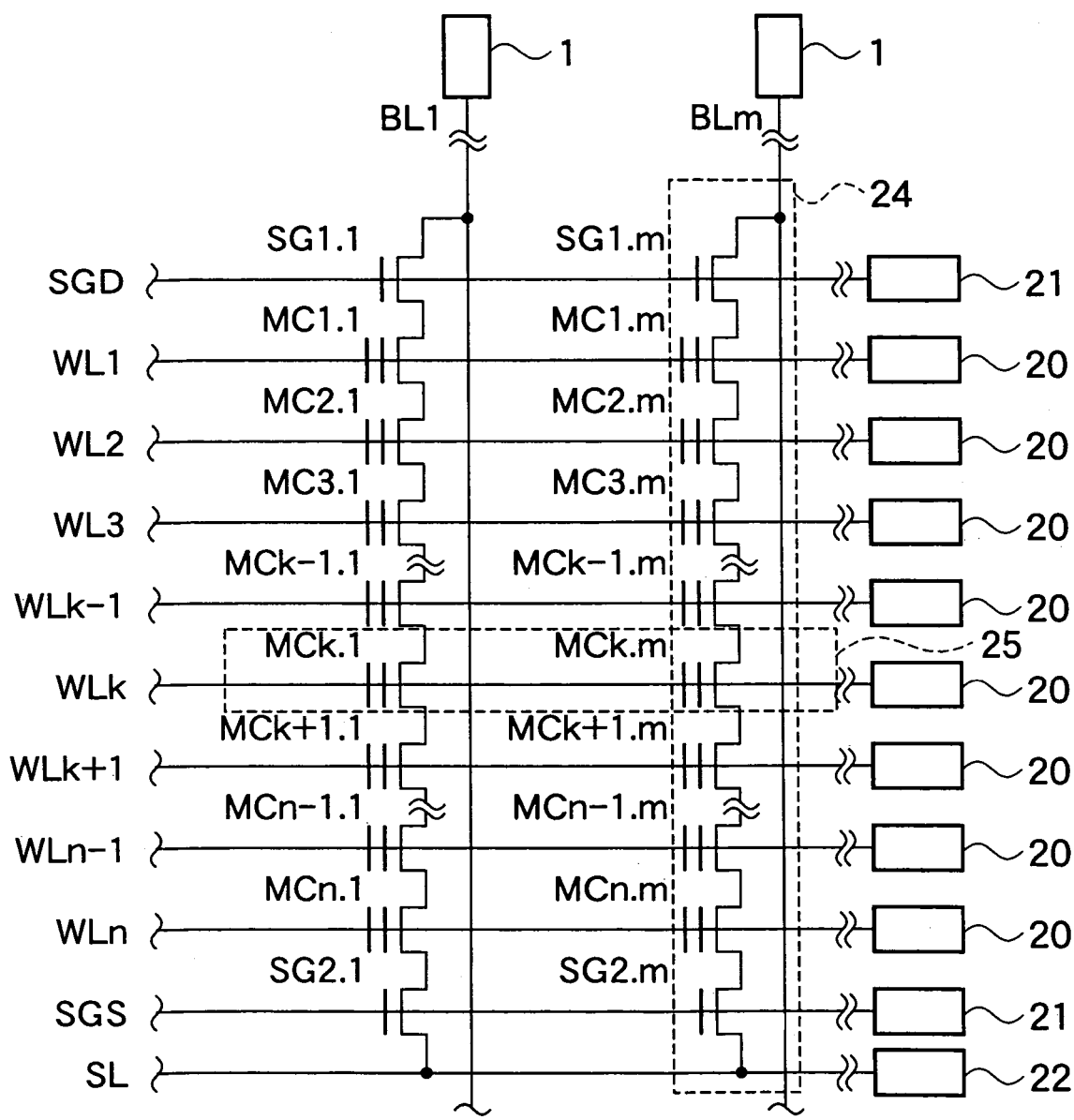
FIG. 21 is a diagram showing an exemplary NAND circuit structure of the nonvolatile semiconductor memory according to the first embodiment of the present invention.

FIG. 21 shows the nonvolatile semiconductor memory according to the first embodiment of the present invention configured as an exemplary NAND memory cell array. The memory cell transistors and the peripheral select gate transistors have a structure where the floating gates 8 and the control gate 2 are stacked via the gate insulating films 30 on the semiconductor substrate 26, as described using FIG. 3 through FIG. 20. A NAND cell unit 24 is configured by serially connecting n memory cell transistors (MC1,m to MCn,m) in a form where adjacent memory cell transistors share either source or drain diffusion layer, and further arranging a select gate transistor (SG1.m and SG2.m) at both ends thereof. The NAND memory cell array has the above NAND cell units 24 arrayed in a matrix. The span of NAND cell units 24 in the same column is a NAND cell block. The drain of one of the select gate transistors (SG1.m) for each NAND cell unit 24 is connected to the bit line (BLm), and the source of the other select gate transistor is connected to the source line (SL), which is shared by multiple NAND cell units 24. The control gates of multiple memory cell transistors and select gate transistors horizontally arranged in the NAND memory cell array are connected in common to control gate lines (word lines) WL and the select gate lines SGD and SGS, respectively. All memory transistors 25 connected to a single control gate line configure a range in which data write-in can be collectively performed. This write-in unit is normally defined as one page. However, recently, there are cases where multiple pages are allotted to a single control gate. In the case where there are n memory transistors in the NAND cell unit 24, there are n control gate lines in a memory cell block. Bit lines BL1 and BL2 are connected to bit line drive circuits 1, respectively, the control gate line WL is connected to control gate line drive circuits 20, respectively, the select gate lines are connected to select gate line drive circuits 21, respectively, and the source line is connected to a source line drive circuit 22.

(Circuit Structure 2)

(NOR Structure)

Figure 22:
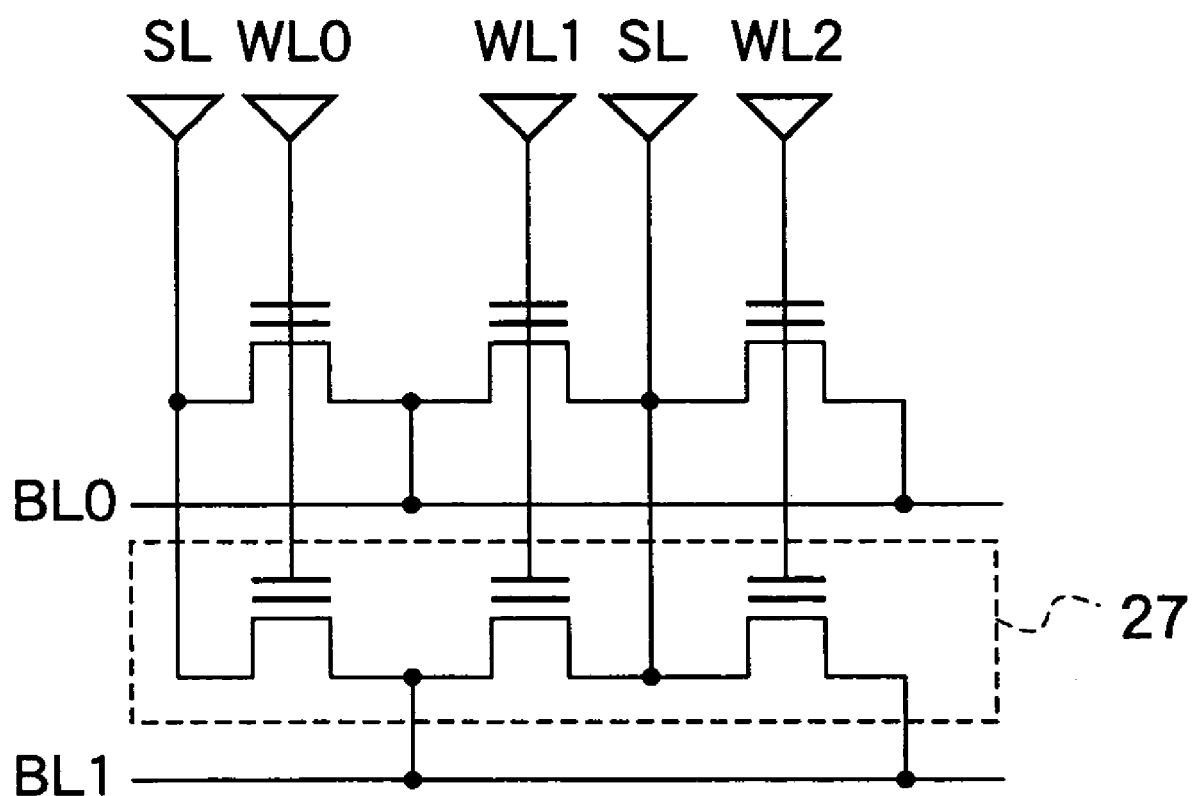
FIG. 22 is a diagram showing an exemplary NOR circuit structure of the nonvolatile semiconductor memory according to the first embodiment of the present invention.

The nonvolatile semiconductor memory according to the first embodiment of the present invention is not limited to only a NAND flash memory, and may also be applied to a NOR flash memory, which has memory cell units shown in the circuit diagram of FIG. 22. An exemplary circuit structure of the nonvolatile semiconductor memory according to the first embodiment of the present invention is configured with a NOR circuit shown in FIG. 22. Each memory cell transistor having a multilayer stacked structure is as described using FIG. 3 through FIG. 20. A NOR cell unit is denoted by 27 and enclosed by a dotted line in FIG. 22. In the NOR cell unit 27, the common source region of two adjacent memory cell transistors is connected to the source line SL, and the common drain region thereof is connected to the bit line BL. It is characterized by a faster read-out operation than with the NAND structure.

(Circuit Structure 3)

(AND Structure)

Figure 23:
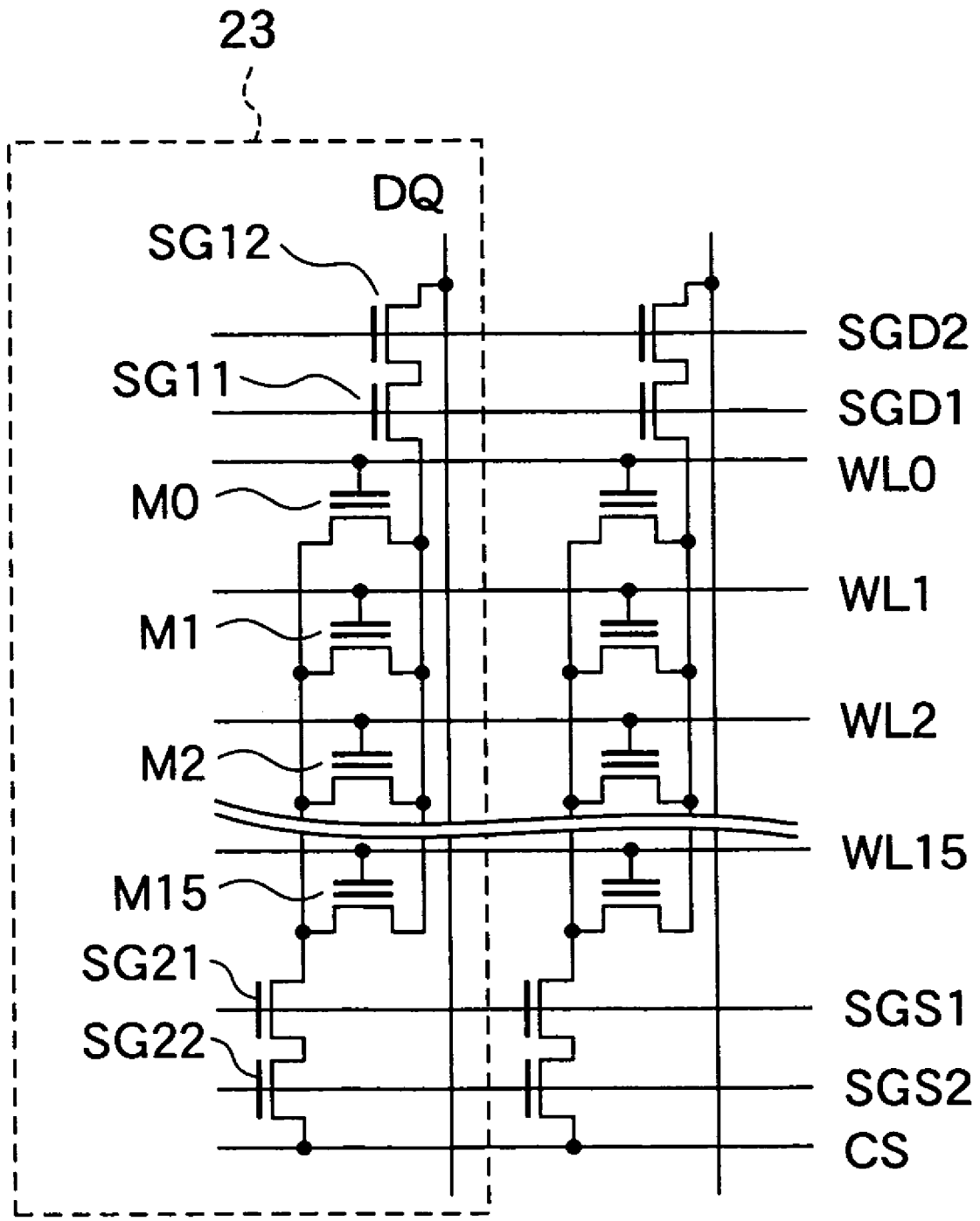
FIG. 23 is a diagram showing an exemplary NAND circuit structure of the nonvolatile semiconductor memory according to the first embodiment of the present invention.

The nonvolatile semiconductor memory according to the first embodiment of the present invention is not limited to only a NAND flash memory, and may also be applied to an AND flash memory, which has memory cell units as shown in the circuit diagram of FIG. 23. An exemplary circuit structure of the nonvolatile semiconductor memory according to the first embodiment of the present invention configured with an AND circuit is shown in FIG. 23. Each memory cell transistor having a multilayer stacked structure is as described using FIG. 3 through FIG. 20. An AND cell unit is denoted by reference numeral 23 and enclosed by a dotted line in FIG. 23. In the AND cell unit 23, respective drain regions of memory cell transistors MO to M15 are connected in common, and respective source regions are also connected in common. In other words, in a memory cell unit of the AND flash memory as shown in FIG. 23, the memory cell transistors MO to M15 are connected in parallel, where two bit line side select transistors SG11 and SG12 are connected on one side thereof, and two source line side select transistors SG21 and SG22 are connected on the other side. Naturally there may also be just one select gate transistor. Each of the memory cell transistors M0 to M15 is connected to a word line WL0 to WL15, respectively. A select gate line SGD1 is connected to the gate of the bit line side select transistor SG11, and a select gate line SGD2 is connected to the gate of the bit line side select transistor SG12. A select gate line SGS1 is connected to the gate of the source line side select transistor SG21, and a select gate line SGS2 is connected to the gate of the source line side select transistor SG22. The drain of the bit line side select transistor SG12 is connected to a bit line DQ, which is a data line. The source of the bit line side select transistor SG22 is connected to a source line CS.

(System Block Structure)

Figure 24:
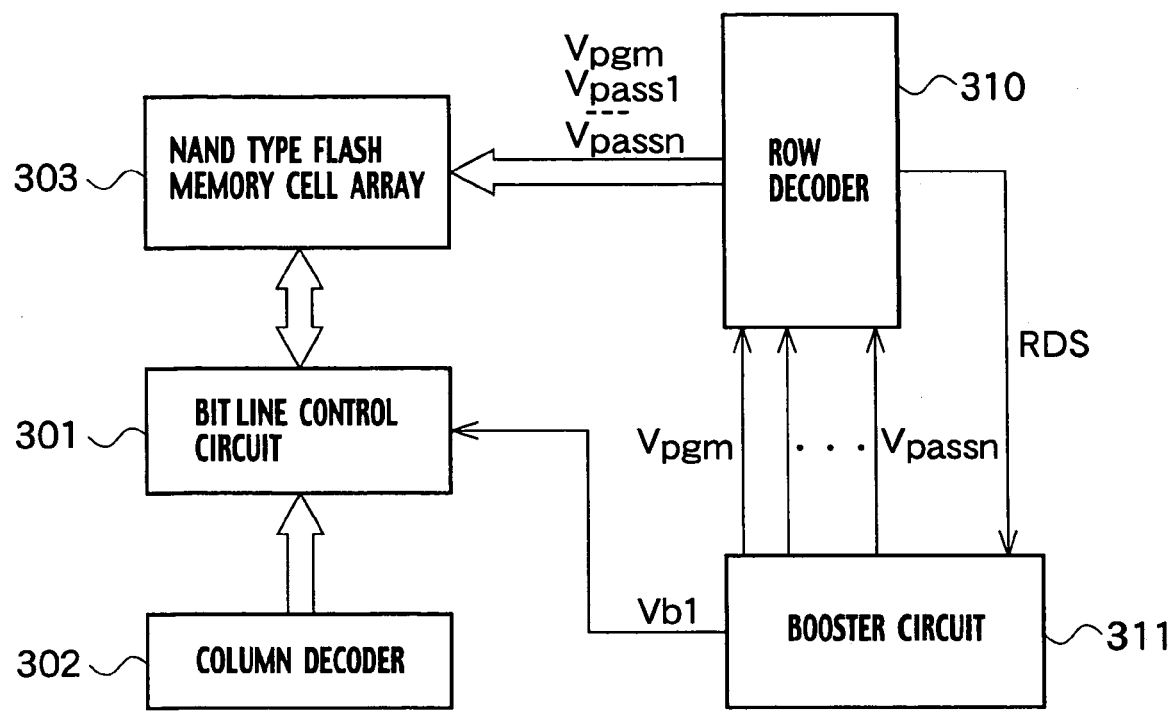
FIG. 24 is a diagram showing an exemplary system block structure of the nonvolatile semiconductor memory according to the first embodiment of the present invention.

The exemplary system block structure of the nonvolatile semiconductor memory according to the first embodiment of the present invention as shown in FIG. 24 is configured with a NAND flash memory array 303, a bit line control circuit 301, a row decoder 310, a column decoder 302, and a booster circuit 311. The nonvolatile memory cell array described with FIG. 21 may be applied to the NAND flash memory array 303. In other words, in the NAND flash memory cell array 303, NAND memory cell units 24, each having a multilayer stacked gate structure as a basic memory cell transistor, are vertically and horizontally arranged in a matrix so as to arrange the word lines WL1 to WLn, which are connected to the respective control gates 2, the bit lines BL1 to BLm, the select gate lines SGD and SGS, and the source line SL and the like. The bit line control circuit 301 and the row decoder 310 are connected to NAND flash memory cell array 303. The bit line control circuit 301 latches write-in data, performs a sensing operation during read-out, and performs related operations. The column decoder 302, which decodes a column address signal so as to select a NAND cell unit column, is connected to this bit line control circuit 301. The booster circuit 311 generates write-in voltage $V_{pgm}$, different multiple intermediate voltages $V_{pass1}$ to $V_{passn}$, and bit line voltage $V_{b1}$ and the like from a power supply voltage. The row decoder 310 supplies a control signal RDS to the booster circuit 311, and receives the write-in voltage $V_{pgm}$ and the intermediate voltages $V_{pass1}$ to $V_{passn}$. It should be noted that the multiple intermediate voltages $V_{pass1}$ to $V_{passn}$ are used for the write-in, read-out and erasure operations for the nonvolatile semiconductor memory according to the embodiments of the present invention, and are mainly applied to the word lines WL1 to WLn, respectively. The row decoder 310 decodes a row address signal, and based on the voltage supplied from the booster circuit 311, outputs the decoded signals, such as write-in voltage $V_{pgm}$, which is used to select a memory cell transistor in the NAND flash memory cell array 303, intermediate voltages $V_{pass1}$ to $V_{passn}$, voltage $V_{sgs}$ to be applied to the select gate line SGS, voltage $V_{sgd}$ to be applied to the select gate line SGD, and voltage $V_{s1}$ to be applied to the source line SL. Accordingly, word lines and select gate lines in the NAND flash memory cell array 303 are selected. Furthermore, the bit line control circuit 301 receives the bit line voltage $V_{b1}$ from the booster circuit 311, supplying the bit line voltage $V_{b1}$ to a NAND cell unit column selected by the column decoder 302. It should be noted that only the minimum circuit configuration is shown in FIG. 24, and in addition to this configuration, an address buffer, a data input/output buffer, and a timing generation circuit and the like are also necessary, however, descriptions thereof are omitted.

Second Embodiment

Figure 25:
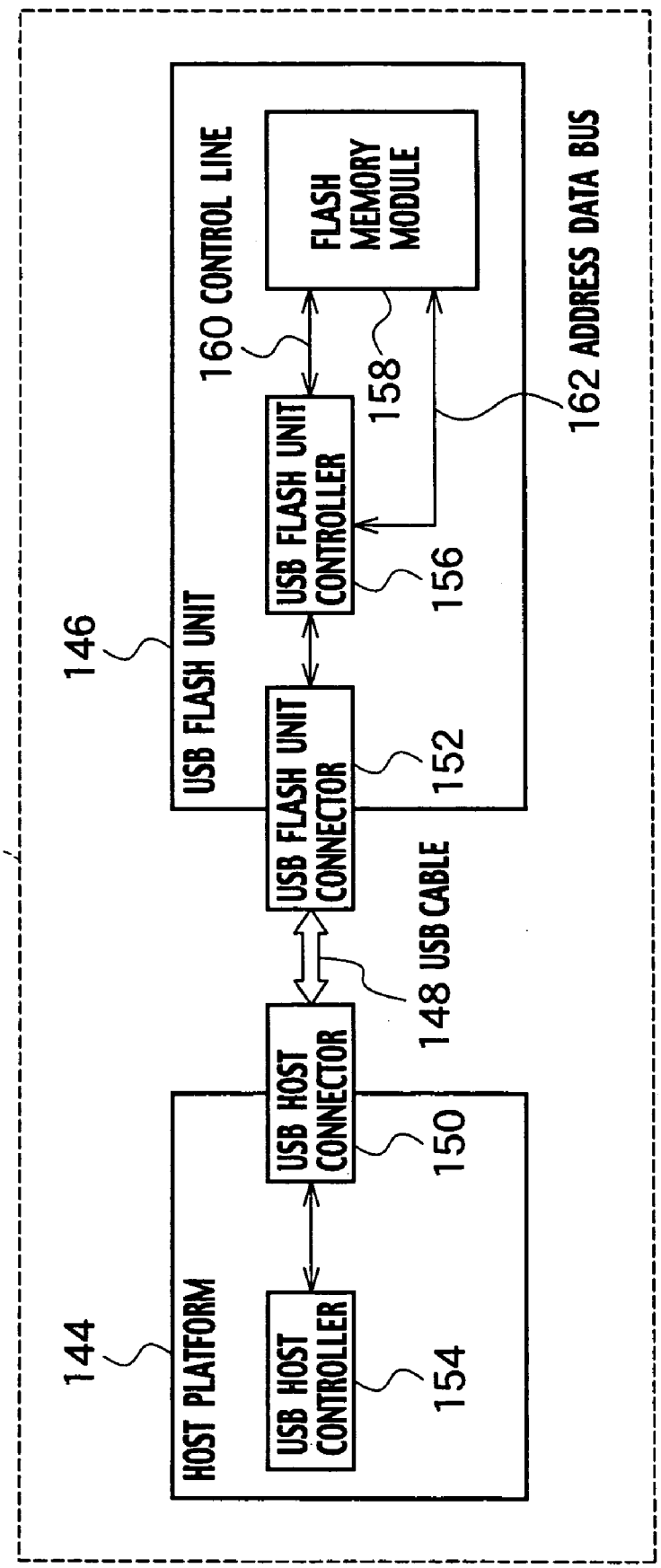
FIG. 25 illustrates a second embodiment of the present invention as an application example for the nonvolatile semiconductor memory according to the first embodiment of the present invention.

An application example of the nonvolatile semiconductor memory according to a second embodiment of the present invention is illustrated in FIG. 25. FIG. 25 is a schematic diagram of principal elements of a flash memory and system according to this embodiment. As shown in the drawing, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first embodiment of the present invention.

When the USB flash unit 146 is connected to the host platform 144, standard USB enumeration processing begins.

In this processing, the host platform 144 recognizes the USB flash unit 146, selects the mode for transmission therewith, and performs reception/transmission of data from/to the USB flash unit 146 via a FIFO buffer called an endpoint, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received the request packet, the request will be accepted by the USB flash unit controller 156.

Next, the USB flash unit controller 156 performs various operations such as read-in, write-in or erasure of data from or to the flash memory module 158. In addition, the controller 156 supports basic USB functions such as acquiring a USB address and the like. The USB flash unit controller 156 controls the flash memory module 158 via either a control line 160, which is used to control output from the flash memory module 158, or, for example, other various signals such as a chip enable signal CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

As described above, the present invention is described according to embodiments; however, it should not be perceived that descriptions and drawings forming a part of this disclosure are intended to limit the spirit and scope of the present invention. Various alternative embodiments, working examples, and operational techniques will become apparent from this disclosure for those skills in the art. Accordingly, the technical scope of the present invention is determined only by specified features of the invention according to the following claims that can be regarded appropriately from the above-mentioned descriptions.

In addition, the embodiments of the present invention can be modified and implemented in various ways as long as not deviating from the scope of the present invention. The present invention naturally includes various embodiments not described herein.

According to the nonvolatile semiconductor memory of the present invention, wide industrial applicability exists not only for a memory card and IC card, but for a vehicle system, a hard disk driver, a portable phone, high-speed network modem equipment, and the like.

It is natural that the present invention covers a variety of embodiments not described herein. Accordingly, the technical scope of the present invention is defined by only the following claims that appear appropriate from the above explanation.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A fabrication method of a nonvolatile semiconductor memory, comprising:
    forming a gate insulating film on a semiconductor substrate;
    forming a floating gate film on the gate insulating film;
    selectively removing a part of the floating gate film so as to define a plurality of floating gates;
    depositing a first interlayer insulating film across the entire surface of the semiconductor substrate so as to fill a gap between the floating gates;
    removing a part of the first interlayer insulating film so as to expose top surfaces of the floating gates by chemical polishing;
    depositing an inter-gate insulating film on the top surfaces of the floating gates;
    removing the inter-gate insulating film in an area other than a memory cell transistor area so as to expose the floating gate;
    depositing a mask insulating film on the inter-gate insulating film and the exposed floating gate;
    forming a device isolation trench in a region for device isolation;
    depositing a buried insulating film across the entire surface of the semiconductor substrate including the device isolation trench;
    removing the mask insulating film;
    forming a control gate film on the inter-gate insulating film and the exposed floating gate;
    selectively etching a part of the control gate film so as to define a plurality of control gates and to expose the inter-gate insulating film;
    further depositing a second interlayer insulating film across the entire surface of the semiconductor substrate so as to fill a gap between the control gates; and
    forming an isolation trench between the memory cell transistor area and a peripheral transistor area,
    wherein the control gate is shared by a plurality of memory cell transistors arranged along a row direction, the inter-gate insulating film is shared by a plurality of memory cell transistors arranged along a column direction and is separated from an adjacent inter-gate insulating film by one of the device isolation trench.

2. A fabrication method of a nonvolatile semiconductor memory, comprising:
    forming a gate insulating film on a semiconductor substrate;
    forming a floating gate film on the gate insulating film;
    depositing a stopper film on the floating gate film;
    selectively removing the stopper film and a part of the floating gate film so as to define a plurality of floating gates and to expose the gate insulating film;
    depositing a first interlayer insulating film across the entire surface of the semiconductor substrate so as to fill a gap between the floating gates;
    removing a part of the first interlayer insulating film so as to expose the stopper film by chemical polishing;
    removing the stopper film so as to expose top surfaces of the floating gates by chemical polishing;
    depositing an inter-gate insulating film on the top surfaces of the floating gate;
    removing the inter-gate insulating film in an area other than a memory cell transistor area so as to expose the floating gate;
    depositing a mask insulating film on the inter-gate insulating film and the exposed floating gate;
    forming a device isolation trench in a region for device isolation;
    depositing a buried insulating film across the entire surface of the semiconductor substrate including the device isolation trench;
    removing the mask insulating film;
    forming a control gate film on the inter-gate insulating film and the exposed floating gate film;
    selectively etching a part of the control gate film so as to define a plurality of control gates and to expose the inter-gate insulating film;
    further depositing a second interlayer insulating film across the entire surface of the semiconductor substrate so as to fill a gap between the control gates; and
    forming an isolation trench between the memory cell transistor area and a peripheral transistor area,
    wherein the control gate is shared by a plurality of memory cell transistors arranged along a row direction, the inter-gate insulating film is shared by a plurality of memory cell transistors arranged along a column direction and is separated from an adjacent inter-gate insulating film by one of the device isolation trench.

* * * * *